United States Patent
Kishino

(10) Patent No.: US 10,622,969 B2
(45) Date of Patent: Apr. 14, 2020

(54) ACOUSTIC WAVE ELEMENT, MULTI PLEXER, AND COMMUNICATION MODULE

(71) Applicant: Kyocera Corporation, Kyoto-shi, Kyoto (JP)

(72) Inventor: Tetsuya Kishino, Kyoto (JP)

(73) Assignee: KYOCERA Corporation, Kyoto (JP)

(*) Notice: Subject to any disclaimer, the term of this patent is extended or adjusted under 35 U.S.C. 154(b) by 400 days.

(21) Appl. No.: 15/532,942

(22) PCT Filed: Dec. 2, 2015

(86) PCT No.: PCT/JP2015/083882
§ 371 (c)(1),
(2) Date: Jun. 2, 2017

(87) PCT Pub. No.: WO2016/088804
PCT Pub. Date: Jun. 9, 2016

(65) Prior Publication Data
US 2018/0269854 A1    Sep. 20, 2018

(30) Foreign Application Priority Data

Dec. 2, 2014  (JP) ................................ 2014-244270

(51) Int. Cl.
*H03H 9/145* (2006.01)
*H03H 9/72* (2006.01)
(Continued)

(52) U.S. Cl.
CPC ............. *H03H 9/72* (2013.01); *H01L 41/047* (2013.01); *H01L 41/1873* (2013.01);
(Continued)

(58) Field of Classification Search
CPC ............ H03H 9/145; H03H 9/25; H03H 9/72; H03H 9/02559; H03H 9/6479; H01L 41/047; H01L 41/1873
See application file for complete search history.

(56) References Cited

U.S. PATENT DOCUMENTS

2007/0030096 A1   2/2007   Nishihara et al.
2015/0070227 A1   3/2015   Kishino et al.
(Continued)

FOREIGN PATENT DOCUMENTS

JP   2002-111444 A   4/2002
JP   2007-74698 A    3/2007
(Continued)

OTHER PUBLICATIONS

International Search Report dated Feb. 2, 2016, issued by Japan Patent Office for International Application No. PCT/JP2015/083882.

*Primary Examiner* — J. San Martin
(74) *Attorney, Agent, or Firm* — Procopio Cory Hargreaves and Savitch LLP

(57) ABSTRACT

The acoustic wave element of the present invention includes a multi-mode type filter and a capacitance part. The multi-mode type filter includes a substrate comprised of a piezoelectric crystal; a first IDT to which a signal is input and a second IDT which is adjacent to this, each IDT including a first comb-shaped electrode and a second comb-shaped electrode which is connected to a reference potential, each comb-shaped electrode being located on the upper surface of the substrate and including a plurality of electrode fingers. The capacitance part is located on the upper surface of the substrate and includes a first counter electrode which is electrically connected to the first IDT at the first comb-shaped electrode side, and a second counter electrode which is arranged at a distance from the first counter electrode and is connected to the reference potential.

20 Claims, 17 Drawing Sheets

(51) Int. Cl.
  *H03H 9/64* (2006.01)
  *H03H 9/25* (2006.01)
  *H01L 41/047* (2006.01)
  *H01L 41/187* (2006.01)
  *H03H 9/02* (2006.01)

(52) U.S. Cl.
  CPC ........ *H03H 9/02559* (2013.01); *H03H 9/145* (2013.01); *H03H 9/25* (2013.01); *H03H 9/6436* (2013.01); *H03H 9/6479* (2013.01); *H03H 9/725* (2013.01)

(56) References Cited

U.S. PATENT DOCUMENTS

| | | | |
|---|---|---|---|
| 2016/0049920 A1 | 2/2016 | Kishino | |
| 2017/0244382 A1* | 8/2017 | Lear | H03H 9/465 |
| 2017/0359050 A1* | 12/2017 | Irieda | H03H 9/70 |
| 2018/0026605 A1* | 1/2018 | Ito | H03H 9/145 |
| | | | 367/135 |
| 2019/0044496 A1* | 2/2019 | Takamine | H04B 1/50 |
| 2019/0058452 A1* | 2/2019 | Takata | H03H 9/02818 |
| 2019/0199321 A1* | 6/2019 | Nosaka | H03H 9/14582 |
| 2019/0214969 A1* | 7/2019 | Wada | H03H 9/02007 |
| 2019/0214970 A1* | 7/2019 | Horita | H03H 9/14544 |
| 2019/0222199 A1* | 7/2019 | Nosaka | H03F 3/213 |
| 2019/0245516 A1* | 8/2019 | Taguchi | H03H 9/25 |
| 2019/0245518 A1* | 8/2019 | Ito | H01Q 1/50 |

FOREIGN PATENT DOCUMENTS

| | | |
|---|---|---|
| JP | 2011-086997 A | 4/2011 |
| WO | 2013/161881 A1 | 10/2013 |
| WO | 2014/133084 A1 | 9/2014 |

* cited by examiner

FIG.3
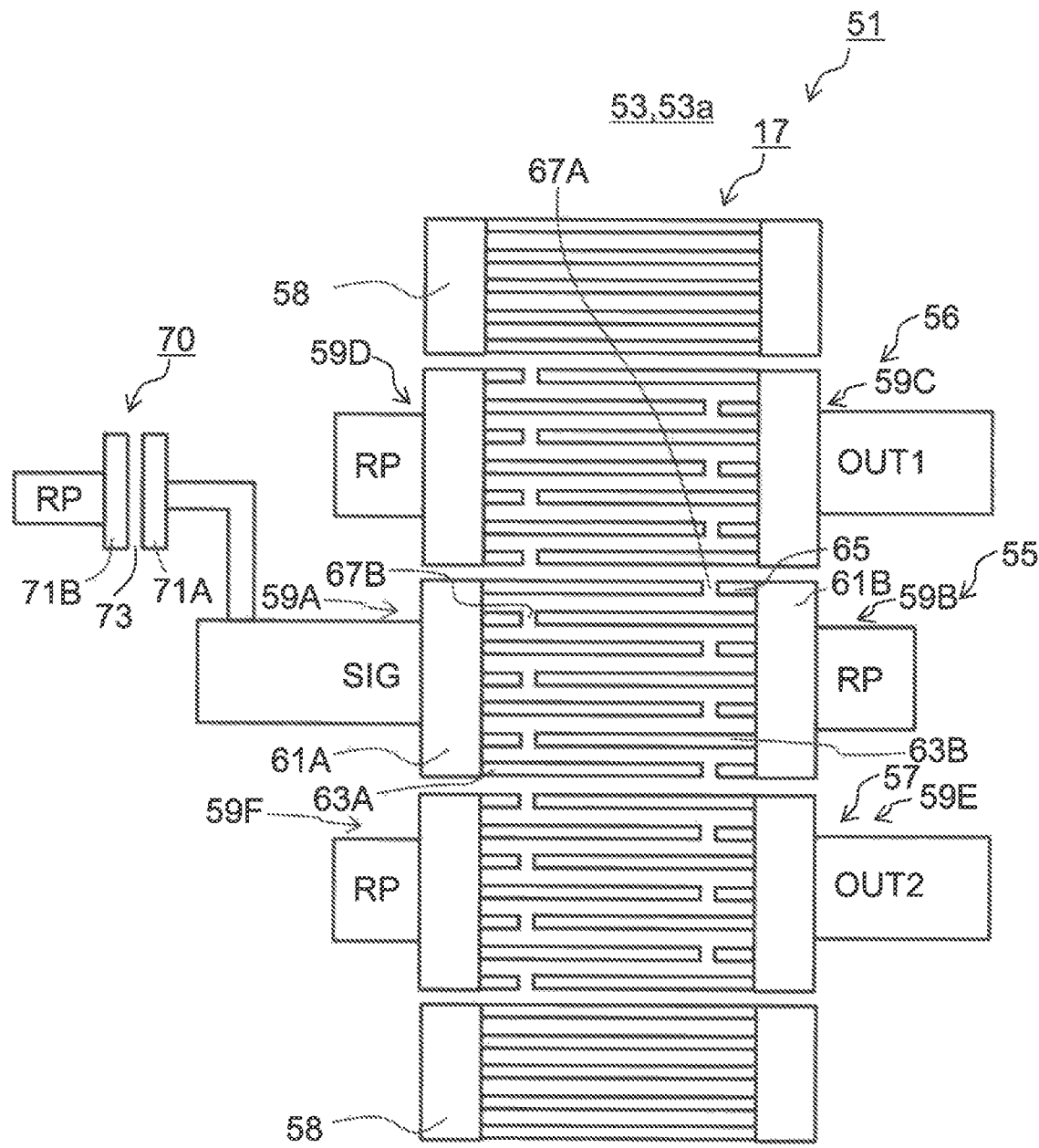
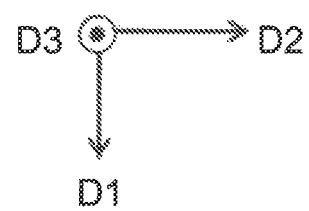

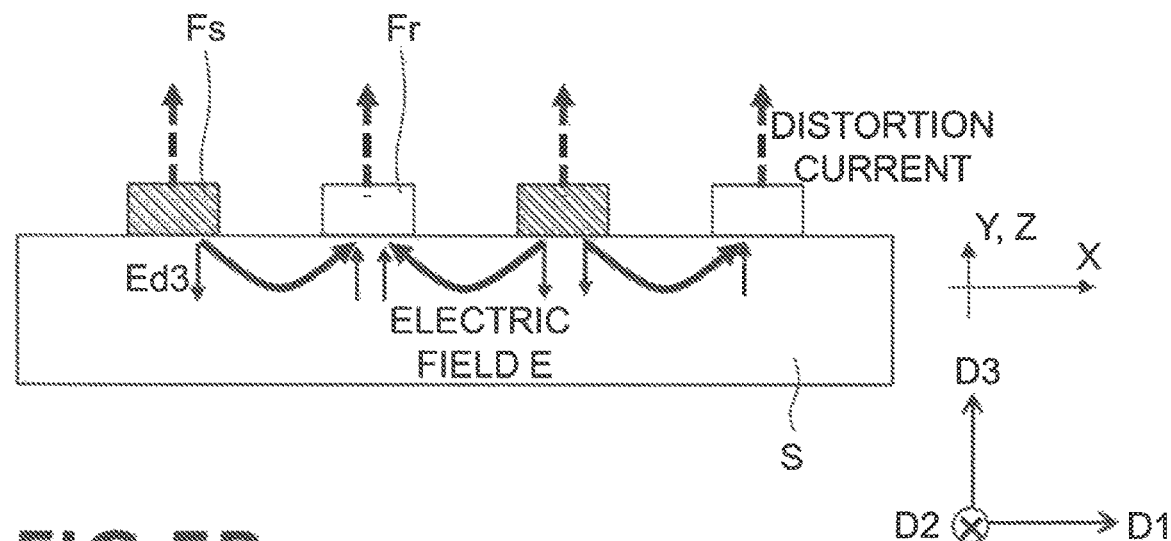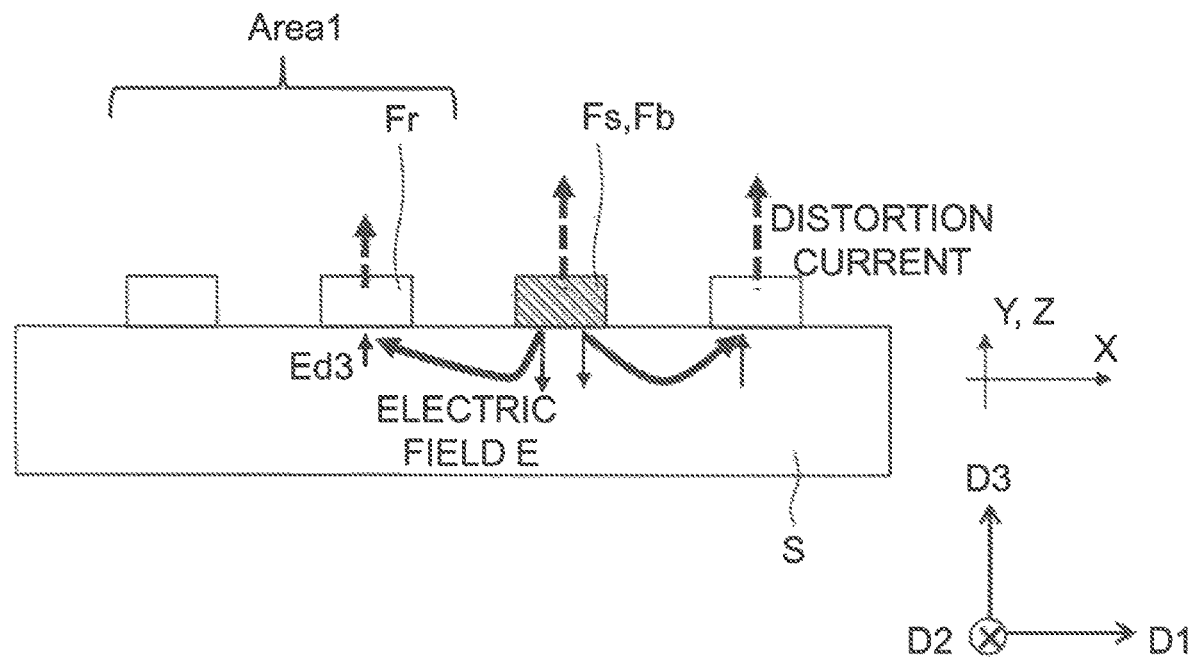

FIG.11
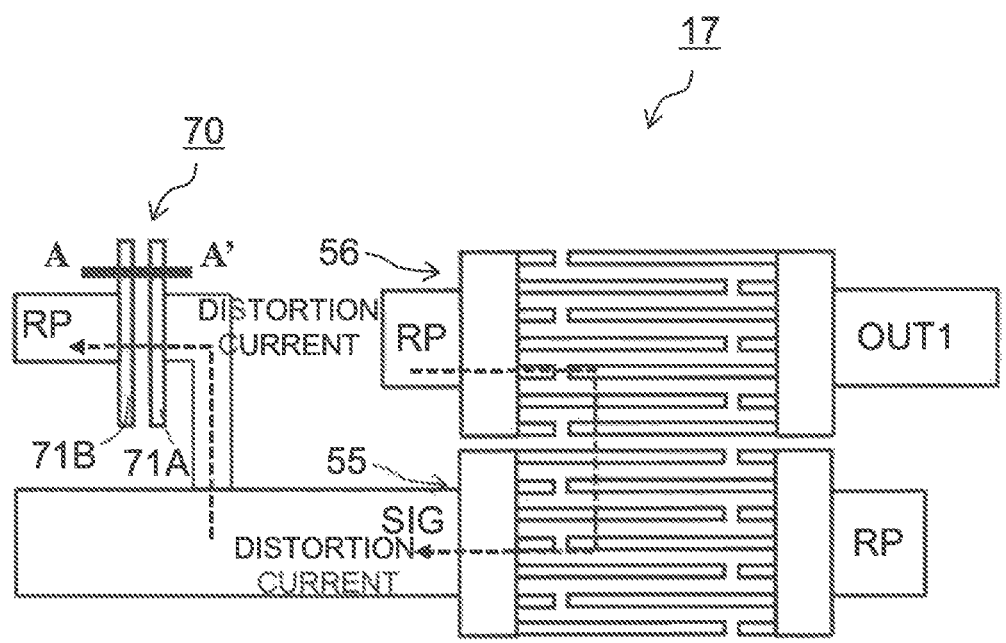
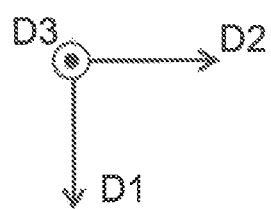

FIG.14
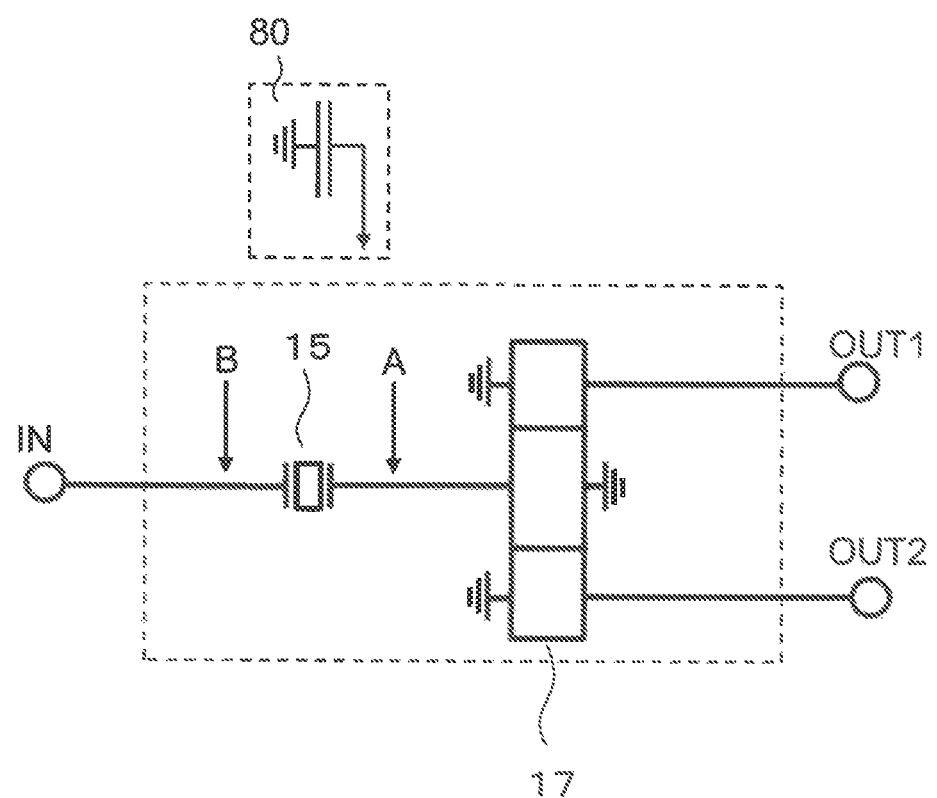
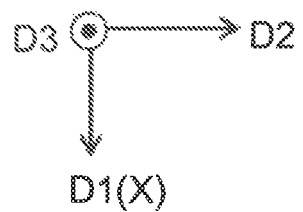

FIG. 17

ACOUSTIC WAVE ELEMENT, MULTIPLEXER, AND COMMUNICATION MODULE

TECHNICAL FIELD

The present invention relates to a surface acoustic wave (SAW) element or other acoustic wave element, a duplexer, and a communication module.

BACKGROUND ART

Known in the art is an acoustic wave element having a piezoelectric substrate and an IDT (InterDigital Transducer) provided on a major surface of the piezoelectric substrate. Such an acoustic wave element is for example utilized in a transmitting filter or receiving filter of a duplexer or the like.

In the acoustic wave element, sometimes electrical characteristics fall due to electrical distortion waves generated due to the nonlinearity of the element. For example, in a duplexer using an acoustic wave element, a disturbance wave out of the transmission band and reception band and a transmission wave are mixed whereby a distortion wave included in the reception band is generated. This distortion wave is called "inter-modulation distortion" (IMD) and is one of the causes of a drop in the quality of communication (SN ratio) of wireless communications. Other than this, there also exists a possibility of the problem that harmonic distortion having a frequency of a whole multiple of the transmission wave will be generated and that this will disturb communications of other wireless apparatuses.

Therefore, in order to suppress a drop in the SN ratio due to a distortion wave, a method of dividing a resonator without changing the electrostatic capacitance is known (for example Japanese Patent Publication No. 2007-074698A). Resonators to be divided are serial resonators or parallel resonators in a ladder type filter which configure a duplexer. The voltage applied to resonators are dispersed by dividing, and therefore, a distortion wave is suppressed.

Note that, while not literature related to the art of suppressing a distortion wave, Japanese Patent Publication No. 5-167384A discloses a capacity element which is provided on a major surface of a piezoelectric substrate and is connected in parallel to the IDT.

However, if resonators are divided without changing the electrostatic capacitance, the resonators become larger in size compared with before division. Consequently, the acoustic wave element becomes larger in size. Further, the technique of dividing the resonators can be applied to a ladder type filter, but cannot be applied to the multi-mode type filter which is generally employed in a receiving filter.

SUMMARY OF INVENTION

Technical Problem

Accordingly, an acoustic wave element, a duplexer, and a communication module capable of suppressing further influence of a distortion wave are desirably provided.

Solution to Problem

An acoustic wave element according to one aspect of the present invention includes a substrate, a multi-mode type filter, and a capacitance part. The substrate is comprised of an $LiTaO_3$ or $LiNbO_3$ piezoelectric crystal. The multi-mode type filter includes a first IDT to which a signal is input and a second IDT which is adjacent to this. The first IDT includes a first comb-shaped electrode and a second comb-shaped electrode which is connected to a reference potential. Each comb-shaped electrode is located on the upper surface of the substrate and includes a plurality of electrode fingers. The capacitance part includes a first counter electrode which is electrically connected to the first IDT at the first comb-shaped electrode side, and a second counter electrode which is arranged at a distance from the first counter electrode and is connected to the reference potential. Each counter electrode is located on the upper surface of the substrate. Further, it includes the configuration of either of (1) or (2):

(1) In the substrate, in a case where a component formed by projection of a Z-axis of the piezoelectric crystal to the direction vertical to the upper surface of the substrate is directed from the lower surface toward the upper surface of the substrate, in the capacitance part, the first counter electrode and the second counter electrode are arranged in the order of the first counter electrode and the second counter electrode along the forward direction of the component formed by projection of the Z-axis of the piezoelectric crystal onto the upper surface of the substrate.

(2) In the substrate, in a case where a component formed by projection of a Z-axis of the piezoelectric crystal to the direction vertical to the upper surface of the substrate is directed from the upper surface toward the lower surface of the substrate, in the capacitance part, the second counter electrode and the first counter electrode are arranged in the order of the second counter electrode and the first counter electrode along the forward direction of the component formed by projection of the Z-axis of the piezoelectric crystal onto the upper surface of the substrate.

Further, an acoustic wave element according to one aspect of the present invention includes a substrate, a multi-mode type filter, and a capacitance part. The substrate is comprised of a piezoelectric crystal. The multi-mode type filter includes a first IDT to which a signal is input and a second IDT which is adjacent to this. The first IDT includes a first comb-shaped electrode and a second comb-shaped electrode which is connected to a reference potential. Each comb-shaped electrode is located on the upper surface of the substrate and includes a plurality of electrode fingers. The capacitance part includes a first counter electrode which is electrically connected to the first IDT at the first comb-shaped electrode side, and a second counter electrode which is arranged at a distance from the first counter electrode and is connected to the reference potential. Each counter electrode is located on the upper surface of the substrate. The first counter electrode and the second counter electrode are arranged in a direction of propagation of the acoustic wave, and the width of the first counter electrode in the direction of propagation of the acoustic wave is larger than the width of the second counter electrode in the direction of propagation of the acoustic wave.

A multiplexer according to one aspect of the present invention includes an antenna terminal, a transmitting filter which is electrically connected to the antenna terminal, and a receiving filter which is electrically connected to the antenna terminal. The transmitting filter includes the above acoustic wave element.

A communication module according to one aspect of the present invention includes an antenna, the above multiplexer which is electrically connected to the antenna, and an RF-IC which is electrically connected to the multiplexer.

Advantageous Effects of Invention

According to the above configurations, an acoustic wave element, a duplexer, and a communication module in which an influence of distortion waves is suppressed can be provided.

BRIEF DESCRIPTION OF DRAWINGS

FIG. 3 is a plan view showing a SAW element including a multi-mode filter of the duplexer in FIG. 2.

FIG. 5A is a cross-sectional view for explaining an electric field distribution inside a piezoelectric substrate S.

FIG. 5B is a cross-sectional view for explaining an electric field distribution inside a piezoelectric substrate S.

FIG. 11 is a plan view showing a principal part of the SAW element in FIG. 3.

FIG. 14 is a circuit diagram schematically showing the configuration of a model according to a working example.

FIG. 17 is a diagram showing the relationship between the Z-axis of the piezoelectric crystal and the capacitance part.

DESCRIPTION OF EMBODIMENTS

Below, a SAW element and duplexer according to an embodiment of the present invention will be explained with reference to the drawings. Note that, the drawings used in the following explanation are schematic ones. Dimensions and ratios etc. on the drawings do not always coincide with the actual ones.

In the explanation of modifications etc., sometimes configurations the same as or similar to the configurations in the already explained embodiments are given the same reference notations as those in the already explained embodiments, and their explanations will be omitted.

<Embodiments>
(Communication Module)

Figure 1:
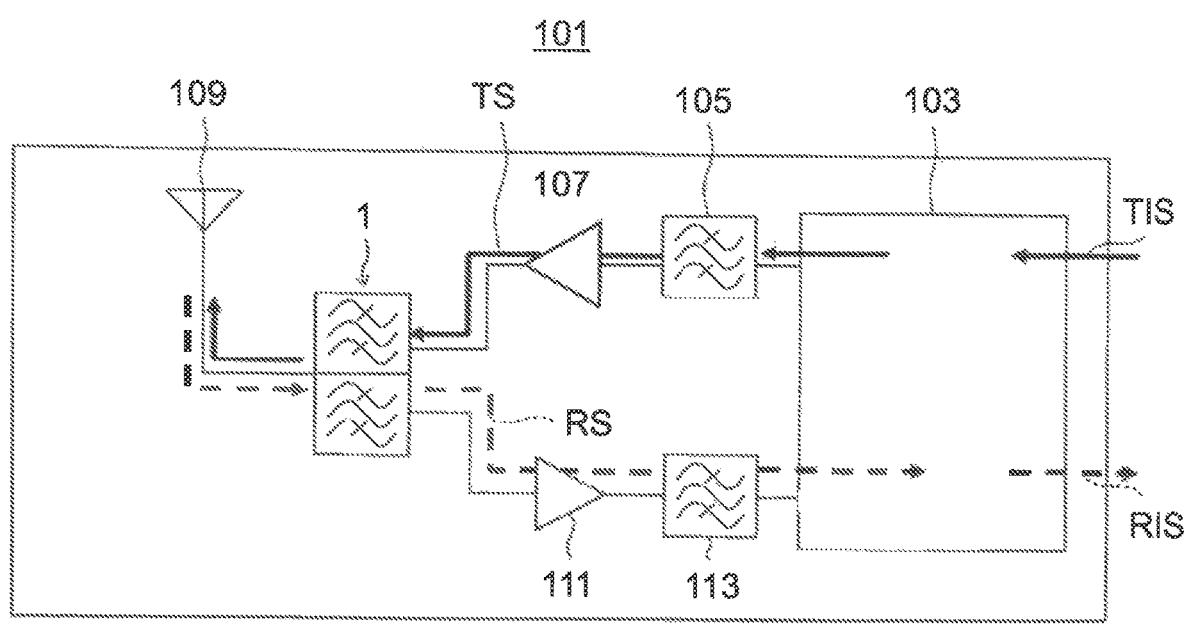
FIG. 1 is a block diagram showing the configuration of a signal processing system of a communication module including a duplexer according to a first embodiment of the present invention.

FIG. 1 is a block diagram showing a principal part of an example of use (communication module 101) of a multiplexer 1 (duplexer) according to a first embodiment of the present invention. The communication module 101 engages in wireless communication utilizing radio waves. The duplexer 1 has a function of branching a signal having a transmission frequency and a signal having a receiving frequency in the communication module 101.

In the communication module 101, a transmission information signal TIS containing the information to be transmitted is modulated and boosted in frequency (is converted to high frequency signal having carrier frequency) by the RF-IC 103 to become a transmission signal TS. The transmission signal TS is stripped of unnecessary components outside the transmission band by a bandpass filter 105, amplified by an amplifier 107, and input to the duplexer 1. Further, the duplexer 1 strips the unnecessary components outside the transmission band from the input transmission signal TS and outputs the result to an antenna 109. The antenna 109 converts the input electrical signal (transmission signal TS) to a wireless signal (radio wave) and transmits the result.

Further, in the communication module 101, a wireless signal (radio wave) received by the antenna 109 is converted to an electrical signal (reception signal RS) by the antenna 109 and is input to the duplexer 1. The duplexer 1 strips the unnecessary components outside the reception band from the input reception signal RS and outputs the result to an amplifier 111. The output reception signal RS is amplified by the amplifier 111 and is stripped of the unnecessary components outside the reception band by a bandpass filter 113. Further, the reception signal RS is lowered in frequency and demodulated by the RF-IC 103 to become a receiving information signal RIS.

Note that, the transmission information signal TIS and receiving information signal RIS may be low frequency signals (baseband signals) containing suitable information and for example analog audio signals or digitalized audio signals. The passband of the wireless signal may be one according to various standards such as the UMTS (Universal Mobile Telecommunications System). The modulation scheme may be any of phase modulation, amplitude modulation, frequency modulation, or a combination of any two or more selected from among them. As the circuit system, a direct conversion system was exemplified in FIG. 1. However, it may be a suitable one other than this. For example, it may be a double super-heterodyne system as well. Further, FIG. 1 schematically shows only the principal part, therefore a low pass filter or isolator etc. may be added to suitable positions or the position of the amplifier or the like may be changed.

(Duplexer)

Figure 2:
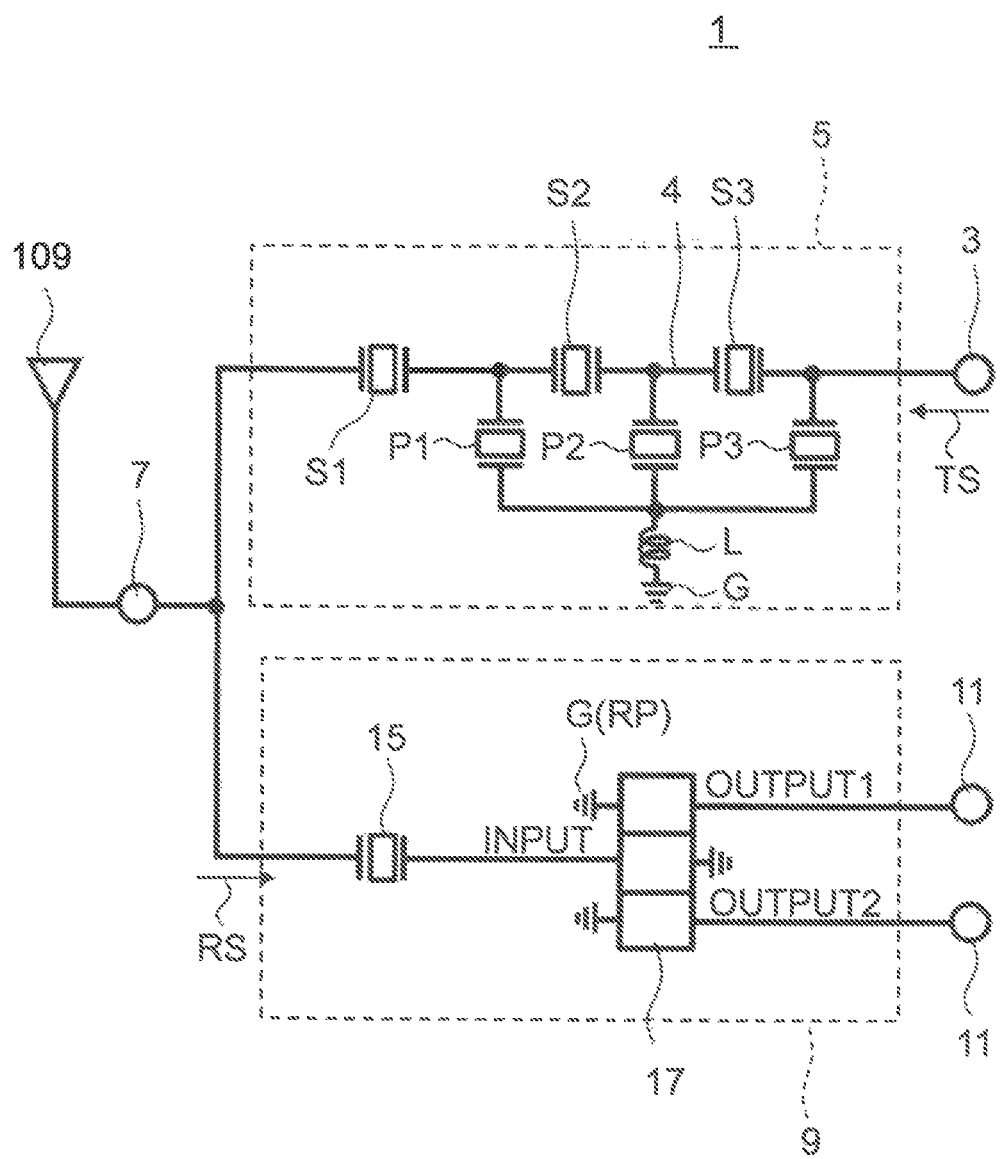
FIG. 2 is a circuit diagram showing the configuration of a duplexer in FIG. 1.

FIG. 2 is a circuit diagram showing the configuration of the duplexer 1.

The duplexer 1 has a transmission terminal 3 to which the transmission signal TS from the amplifier 107 is input, a transmitting filter 5 which strips the unnecessary components outside the transmission band from the transmission signal TS and outputs the result, and an antenna terminal 7 to which the signal from the transmitting filter 5 is input. The antenna terminal 7 is connected to the antenna 109.

Further, the duplexer 1 has a receiving filter 9 which strips the unnecessary components other than the reception band from the reception signal RS input from the antenna 109 through the antenna terminal 7, and reception terminals 11 to which the signals from the receiving filter 9 are input. The reception terminals 11 are connected to the amplifier 111.

The transmitting filter 5 is for example configured by a ladder type SAW filter. That is, the transmitting filter 5 has one or more (three in the present embodiment) serial resonators S1 to S3 which are connected in series between the input side and the output side thereof and one or more (three in the present embodiment) parallel resonators P1 to P3 which are provided between that serial line and the reference potential part.

Between the parallel resonators P1, P2, and P3 and the reference potential part G, an inductor L is provided. By setting the inductance of this inductor L to a predetermined value, an attenuation pole is formed out of the band of the passing frequency of the transmission signal, and thus the out-of-band attenuation can be made larger. Each of these serial resonators S1 to S3 and parallel resonators P1 to P3 is configured by a SAW resonator.

The receiving filter 9 for example has a multi-mode type filter 17 and an auxiliary resonator 15 which is connected in series to the input side thereof (it will be sometimes simply referred to as the "resonator 15".) Note that, in the present embodiment, the multi-mode includes a double mode. The multi-mode type filter 17 has a balance-unbalance conversion function. The receiving filter 9 is connected to two reception terminals 11 to which the balanced signals are output.

Between the connection point of the transmitting filter 5, receiving filter 9, and antenna terminal 7 and the reference potential part G, an impedance matching circuit configured by an inductor or the like may be inserted as well.

(SAW Element)

FIG. 3 is a plan view showing a portion of the configuration of a surface acoustic wave (SAW) element or other acoustic wave element 51 (below, referred to as a "SAW element 51"). The SAW element 51 for example configures the receiving filter 9 of the duplexer 1 shown in FIG. 2 and is provided with a substrate 53 having piezoelectricity, and a multi-mode type filter 17, an auxiliary resonator 15 and a capacitance part 70 which are formed on the substrate 53. FIG. 3 shows only portions of the multi-mode type filter 17 and capacitance part 70. Further, in FIG. 3, substantially the entire surface of the drawing sheet is defined as the major surface of the substrate 53. The periphery of the substrate 53 is not displayed.

Note that, in the SAW element 51, any direction may be defined as the upper part or lower part. In the following description, however, for convenience, an orthogonal coordinate system comprised of a first direction D1, second direction D2, and third direction D3 which are perpendicular to each other is defined, and the "upper surface", "lower surface", and other terms will be used while defining the positive side of the D3 direction (this side of the drawing sheet in FIG. 3) as the upper part. Further, sometimes the D3 direction will be also referred to as the depth direction.

The multi-mode type filter 17 is for example a longitudinally coupled one and has a plurality of (three in the present embodiment) IDTs (first IDT 55, second IDT 56, and third IDT 57) which are arrayed in the direction of propagation of the SAW (D1 direction) and reflectors 58 which are arranged on the two sides of them. The reception signal RS is input to the first IDT 55 positioned at the center among the three IDTs 55 to 57 and is output from the second IDT 56 and third IDT 57 which are positioned on the two sides of the first IDT 55.

Note that, the SAW element 51, in addition to the above, may have an additional film which is arranged on the upper surfaces of the IDT 55 to IDT 57, reflectors 58, and capacitance part 70; an adhesive layer interposed between the substrate 53 and component(the IDT 55 to IDT 57, reflectors 58, and capacitance part 70); and a protective layer covering the upper surface 53a of the substrate 53 from above the IDT 55 to IDT 57, reflectors 58, and capacitance part 70 (or additional film) as well. Further, in FIG. 3, illustration of the portions of the lines for inputting/outputting the signals to/from the IDT 55 to IDT 57 and capacitance part 70 is omitted. Further, the terminal at the side of input of the signal to the first IDT 55 will be defined as the signal terminal (SIG), and the terminals on the side of output of the signals of the second IDT 56 and third IDT 57 will be defined as the output terminals (OUT1, OUT2).

Figure 4:
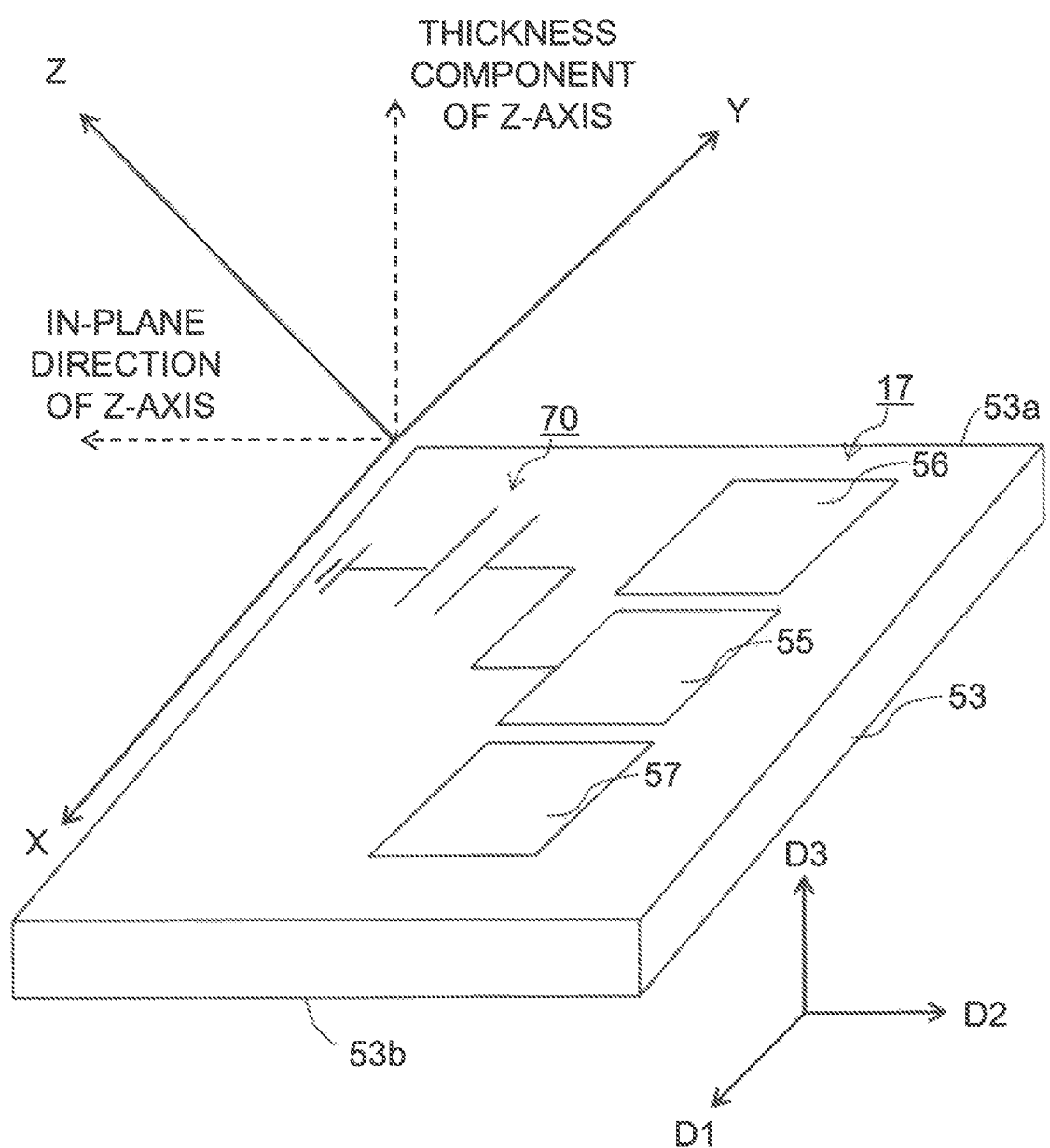
FIG. 4 is a perspective view showing the relationship between the SAW element in FIG. 3 and a crystal orientation of the substrate.

The substrate 53 is configured by a substrate of piezoelectric crystal. For example, the substrate 53 is configured by a substrate of a single crystal having piezoelectricity such as a lithium niobate ($LiNbO_3$) single crystal. More preferably, the substrate 53 is configured by a rotated Y-cut X-propagating $LiTaO_3$ substrate or $LiNbO_3$ substrate. Here, as the example when using the rotated Y-cut X-propagating piezoelectric crystal, for a 42°-rotated Y-cut X-propagating piezoelectric crystal, the relationships between the crystal axes (X-axis, Y-axis, Z-axis) of the piezoelectric crystal configuring the substrate 53 and arrangement of various electrodes such as the IDT 55 to IDT 57, reflectors 58, and capacitance part 70 will be shown in FIG. 4. FIG. 4 is a perspective view schematically showing the configuration of the SAW element 1. Illustration of part of the components is omitted. As shown in FIG. 4, the direction along with the direction of array (D1 direction) of the IDT 55 to IDT 57 is made to match the X-axis of the piezoelectric crystal of the substrate 53.

Returning to FIG. 3, the IDT 55 to IDT 57 are configured by conductive patterns (conductive layers) formed on the upper surface 53a of the substrate 53. The first IDT 55 has a first comb-shaped electrode 59A and second comb-shaped electrode 59B, the second IDT 56 has a first comb-shaped electrode 59C and second comb-shaped electrode 59D, and the third IDT 57 has a first comb-shaped electrode 59E and second comb-shaped electrode 59F.

Note that, in the following description, sometimes the first comb-shaped electrodes 59A, 59C, and 59E and second comb-shaped electrodes 59B, 59D, and 59F will be simply referred to as the "comb-shaped electrodes 59" and will not be discriminated. Further, for the configuration etc. according to the first comb-shaped electrode 59A, sometimes the terms "first" and "A" will be attached like with the "first bus bar 61A". For the configuration etc. according to the second comb-shaped electrode 59B, sometimes the terms "second" and "B" will be attached like with the "second bus bar 61B". Further, "first", "second", "A", and "B" will be sometimes omitted. This is true also for the first comb-shaped electrodes 59C and 59E and second comb-shaped electrodes 59D and 59F.

Each comb-shaped electrode 59 has two bus bars 61 which face each other, a plurality of electrode fingers 63 extending from each bus bar 61 to the other bus bar 61 side, and a plurality of dummy electrodes 65 each of which extends from each bus bar 61 to the other bus bar 61 side among a plurality of electrode fingers 63. Further, a pair of comb-shaped electrodes 59 is arranged so that the plurality of electrode fingers 63 mesh (cross) with each other.

Note that, the direction of propagation of the SAW is defined by the orientation etc. of the plurality of electrode fingers 63. In the present embodiment, however, sometimes the orientations etc. of the plurality of electrode fingers 63 will be explained for convenience by using the direction of propagation of the SAW as a reference.

The bus bar 61 is for example formed in a long shape so as to linearly extend in the direction of propagation of the SAW (D1 direction) with a substantially constant width. Further, the pair of bus bars 61 face each other in a direction (D2 direction) crossing with (perpendicular to in the present embodiment) the direction of propagation of the SAW. Further, the pair of bus bars 61 are parallel to each other. The distance between the pair of bus bars 61 is constant in the direction of propagation of the SAW.

The plurality of electrode fingers 63 are formed in a long shape so as to linearly extend in a direction (D2 direction) perpendicular to the direction of propagation of the SAW with a substantially constant width and are arrayed at substantially constant intervals in the direction of propagation of the SAW (D1 direction). The plurality of electrode fingers 63 of the pair of comb-shaped electrodes 59 are provided so that for example the pitch "p" thereof (the distance between the centers of widths of the electrode fingers 63) becomes equal to the half wavelength of the wavelength λ of the SAW at the frequency to be resonated. The wavelength λ is for example 1.5 μm to 6 μm.

The lengths of the plurality of electrode fingers 63 (positions of tips) are for example made equal to each other. Further, the widths "w" of the plurality of electrode fingers 63 are for example made equal to each other. Note that, these dimensions may be suitably set in accordance with the electrical characteristics etc. which are demanded from the SAW element 51. For example, the width "w" is 0.4 p to 0.7 p with respect to the pitch "p" of the plurality of electrode fingers 63.

The plurality of dummy electrodes 65 are for example formed in long shapes so as to linearly extend in a direction (D2 direction) perpendicular to the direction of propagation of the SAW with substantially constant widths, and are arranged at the centers between two or more electrode fingers 63 (arranged with equal pitch to that of the plurality of electrode fingers 63). Further, the tip of a dummy electrode 65 of one comb-shaped electrode 59 faces the tip of an electrode finger 63 of the other comb-shaped electrode 59 through a gap 67 (first gap 67A, second gap 67B). The width (D1 direction) of a dummy electrode 65 is for example equal to the width "w" of an electrode finger 63. The lengths (D2 direction) of the plurality of dummy electrodes 65 are for example equal to each other.

The number of the plurality of gaps 67 is the same as the number of the plurality of electrode fingers 63. Further, the widths w1 of the plurality of gaps 67 are equal to the widths of the plurality of electrode fingers 63 and the widths of the plurality of dummy electrodes 65 and are equal to each other among the gaps 67. The lengths d1 of the plurality of gaps 67 (sizes in the D2 direction, below, the lengths of the gaps will be sometimes referred to as the "gap lengths") are the same as each other among the gaps 67. The gap lengths d1 may be suitably set in accordance with the electrical characteristics etc. which are demanded from the SAW element 51. For example, the gap lengths d1 are 0.2λ to 1.2λ.

The IDT 55 to IDT 57 are for example formed by metal. As this metal, for example there can be mentioned Al or an alloy containing Al as the principal ingredient (Al alloy). The Al alloy is for example an Al—Cu alloy. Note that, the IDT 55 to IDT 57 may be configured by pluralities of metal layers as well. The thicknesses of the IDT 55 to IDT 57 may be suitably set.

When a voltage is applied to the substrate 53 by the first IDT 55, in the vicinity of the upper surface 53a of the substrate 53, a SAW which is propagated along the upper surface 53a in the D1 direction is induced. Further, the SAW is reflected by the electrode fingers 63. Further, a standing wave having the pitch "p" of the electrode fingers 63 as the half wavelength is formed. This standing wave is longitudinally coupled with the adjacent second IDT 56 and third IDT 57. From the second IDT 56 and third IDT 57, this is converted to an electrical signal having the same frequency as that of the standing wave and is extracted by the electrode fingers 63. More specifically, the signal which is input through an electrical line connected to the first comb-shaped electrode 59A of the first IDT 55 is output through electrical lines which are connected to the first comb-shaped electrodes 59C and 59E of the second IDT 56 and third IDT 57. Note that, the second comb-shaped electrodes 59B, 59D, and 59F of the IDT 55 to IDT 57 are connected to the reference potential (RP). As RP, a ground potential can be exemplified. In this way, the multi-mode type filter 17 functions as the filter.

The reflectors 58 are configured by conductive patterns (conductive layers) formed on the upper surface 53a of the substrate 53. A plurality of electrode fingers are formed at intervals so that the clearances between the electrode fingers form slit shapes in a plan view. That is, each reflector 58 has a pair of bus bars (notation omitted) facing each other in the direction crossing the direction of propagation of the SAW and a plurality of electrode fingers (notation omitted) which extend in a direction (D2 direction) perpendicular to the direction of propagation of the SAW between these bus bars. The plurality of electrode fingers of the reflector 58 are arrayed with substantially equal pitches to those of the plurality of electrode fingers 63 in the IDT 55.

(Configuration for Suppressing Distortion Wave)

The SAW element 51, in addition to the basic configuration described above, has the capacitance part 70 for suppressing the influence of a distortion wave exerted upon the SN ratio.

The capacitance part 70 is comprised of a conductive pattern (conductive layer) formed on the upper surface 53a of the substrate 53 and is a so-called "gap type capacitor". Specifically the capacitance part 70 has a first counter electrode 71A and second counter electrode 71B which face each other. The counter electrodes 71 are for example formed in long shapes so as to linearly extend in the direction of propagation of the SAW (D1 direction) with substantially constant widths and face each other through a third gap 73 in a direction (D2 direction) perpendicular to the direction of propagation of the SAW (D1 direction).

The first counter electrode 71A is electrically connected to the comb-shaped electrode on the input side of the first IDT 55, that is, the first comb-shaped electrode 59A, while the second counter electrode 71B is connected to the reference potential. On the other hand, the direction from the first counter electrode 71A to the second counter electrode 71B, as will be explained later, is determined relation to the crystal axis (Z-axis) of the piezoelectric crystal of the substrate 53. In the present example using this rotated Y-cut X-propagating substrate 53, the first counter electrode 71A and second counter electrode 713 are arranged in order along the forward direction of the component (in-plane direction component) formed when projecting the Z-axis onto the plane formed by the D1 direction and D2 direction (upper surface 53a of the substrate 53). That is, the direction from the first counter electrode 71A to the second counter electrode 71B becomes the −D2 direction. Note that, for the component (thickness direction component) formed when projecting the Z-axis to the direction vertical to the upper surface 53a, in the present example, the direction from the lower surface 53b (see FIG. 4) side of the substrate 53 toward the upper surface 53a side becomes the forward direction.

(Configurations of Other Resonators Etc.)

Each of the resonator 15 and the serial resonators S1 to S3 and parallel resonators P1 to P3 configuring the transmitting filter 5 shown in FIG. 2 can be configured by for example an IDT such as shown in the first IDT 55 and two reflectors which are arranged on the two ends of the same.

The plurality of resonators 15 and transmitting filter 5 are for example provided together on the upper surface 53a of one substrate 53. The directions of propagation of the SAWs are the same as each other. Note that, FIG. 2 is a circuit diagram, therefore the resonators 15 etc. are shown without unifying the directions of propagation of the SAWs.

(Principle of Generation of Distortion Wave)

Here, the principle of generation of the distortion wave in the multi-mode type filter 17 will be studied. When an electric field is applied to the piezoelectric crystal by the electrodes, a distortion current in accordance with that electric field flows according to the second-order nonlinearity of the dielectric constant and is output as the distortion wave to the outside. This basic principle is simple. However, in an actual SAW device and additional capacitance, an electric field is excited inside the piezoelectric crystal by the IDTs or interdigital electrodes formed on the surface of the piezoelectric crystal, therefore the electric field does not have a simple form. It has a in-plane direction component and depth direction component. The nonlinearity of an anisotropic dielectric constant corresponds to this electric field, thereby generating a distortion current (in-plane direction effect and depth direction effect) caused by each. The actually observed distortion wave becomes the sum of these distortion currents including phases (polarities).

A SAW device, which is configured by using the rotated Y-cut X-propagating piezoelectric crystal as the piezoelectric substrate S and forming a plurality of electrode fingers F in alignment in the X-axis (D1 direction) on the surface of the substrate, is used as the model to explain the principle of generation of distortion wave. In this example, the rotation angle is more over 0° to less than 90°. FIGS. 5A and 5B show the states of the electric field E excited by the electrode fingers F inside the piezoelectric substrate S. FIGS. 5A and 5B are cross-sectional views on the plane along the direction of propagation of the SAW (X-axis direction, D1 direction). FIG. 5A is a partial cross-sectional view of a portion in which electrode fingers Fs to which the signal is input and electrode fingers Fr connected to the reference potential are alternately arranged in a constant interval. This for example corresponds to the vicinity of the center of the IDT.

On the other hand, FIG. 5B is a cross-sectional view of a portion in which the electrode fingers Fs and the electrode fingers Fr are not alternately arranged. Specifically, it shows a case where only electrode fingers Fr are arranged at one side of an electrode finger Fs which is sandwiched between them. Such an array corresponds to for example a region from the end part of the IDT to the reflector.

Note that, the portion where the electrode finger Fs nearest the portion configured by only the electrode fingers Fr is positioned will be referred to as the "boundary portion". This electrode finger Fs will be referred to as the "end part electrode finger Fb". Note that, in order to facilitate understanding, hatching is applied to the electrode finger Fs. Further, in FIG. 5B, the region in which the reflector is arranged is shown as "Area 1".

When such electrode fingers F are used, the electric field E is excited in direction from a high potential side toward a low potential side. Note that, in order to facilitate the explanation, the description will be made as if a static voltage were applied to the electrode fingers F. However, the signal which is actually applied to the electrode fingers F is an AC signal having a high frequency. The explanation from here is for a certain instantaneous state of the AC signal. Specifically, it shows the state at the moment when the electrode fingers Fs behave as positive electrodes and the electrode fingers Fr behave as negative electrodes. In the case shown in FIG. 5A, the electrode fingers Fs and Fr are alternately arranged, therefore the electric fields E generated on the two sides of one electrode finger F is symmetric. On the other hand, in the case shown in FIG. 5B, the electrode fingers Fs and Fr are not alternately arranged, therefore it is presumed that the electric fields generated on the two sides of the end part electrode finger Fb become asymmetric.

Here, in the $LiTaO_3$ substrate or $LiNbO_3$ substrate, the nonlinearity of the dielectric constant of the Z-axis direction of the crystal is large, therefore the electric field in the Z-axis direction largely contributes to the distortion current. The component of the Z-axis direction in the case of using the rotated Y-cut X-propagating piezoelectric crystal S exemplified here is comprised of a component in the D2 direction and a component in the D3 direction when viewed in an orthogonal coordinate system and does not contain the component in the D1 direction (see FIG. 4). For this reason, the electric field E is divided into electric fields Ed1 and Ed2 as in-plane direction components and an electric field Ed3 as a depth direction component. The electric field Ed1 is the component extending in the right and left direction on the drawing sheet in FIGS. 5A and 5B, the electric field Ed2 is the component extending in the direction vertical to the drawing sheet of FIGS. 5A and 5B, and the electric field Ed3 is the component extending in the up and down direction on the drawing sheet in FIGS. 5A and 5B.

Here, the electric field Ed1 directed from one to the other of the adjacent electrode fingers F becomes vertical to the Z-axis and does not have a Z-axis direction component, therefore the contribution with respect to the distortion current becomes small. Contrary to this, the electric field Ed3 has a component of the Z-axis direction, therefore it contributes to the generation of distortion current.

In FIG. 5A, the electric fields E on the two sides sandwiching an electrode finger F therebetween are symmetric, therefore the electric fields Ed3 generated in the electrode fingers F have the same magnitude, but alternately have positive and negative polarities. In this regard, the direction (polarity) of the distortion current caused by the secondary nonlinearity does not depend upon the orientation of the electric field, but depends only on the orientation of the crystal. Therefore, in the case shown in FIG. 5A, among the distortion currents generated according to the electric fields Ed3, the distortion current appearing in an electrode finger Fs and the distortion current appearing in an electrode finger Fr have the same magnitude and have the same direction as well. These two distortion currents are cancelled by each other. Therefore, a distortion current which is generated due to the secondary nonlinearity of the dielectric constant is small in the usual IDT in which the electrode fingers Fs and the electrode fingers Fr are alternately arrayed.

Note that, in this diagram, it is assumed that the second-order distortion current is generated in the positive direction of the Z-axis. However, in an actual piezoelectric crystal, there also exists a case where it is generated in the negative direction depending on the sign of the nonlinear coefficient. Also, in the following explanation, it is assumed that the second-order distortion current is generated in the positive direction of the Z-axis. However, even in the case where it is generated in the negative direction, the same explanation works by inverting all signs. Further, in the drawing, the distortion currents are indicated by broken lines, the electric fields E are indicated by wide solid lines, and the electric fields Ed3 each containing the Z-axis component of the electric field E are indicated by thin solid lines.

Contrary to this, in the example shown in FIG. 5B, on the two sides of the end part electrode finger Fb, the electric fields E become asymmetric. This is because the potentials of the electrode fingers F are not symmetric on the two sides of the end part electrode finger Fb (right and left direction in the drawing). Specifically, on the side of the electrode fingers Fr of the portion (Area 1) where only electrode fingers Fr are arrayed other than the boundary portion, the lines of electric force end up expanding and the electric field concentrates in the vicinity of the end part electrode finger Fb, therefore the electric fields E become asymmetric.

In this way, by the electric field E becoming larger in the vicinity of the end part electrode finger Fb than in the vicinity of the electrode finger Fr nearest the boundary portion, a difference is also generated in the electric field Ed3 accompanied with this, therefore the distortion current which is generated in the end part electrode finger Fb becomes larger than the distortion current generated in the electrode finger Fr nearest the boundary portion, so they no longer can be cancelled by each other. For this reason, the net distortion current ends up being output as the distortion wave to the outside. Specifically, in this example, a distortion current is generated from the side connected to the reference potential to the input signal terminal SIG side to which the signal is input. The present inventors intensively studied this and learned the principle of generation of such a distortion current.

Note that, in the above description, a simplified explanation was given for facilitating understanding of the principle of generation of a distortion current. More concretely, however, it is necessary to find the distortion wave which is generated between the electrode fingers F from an anisotropic equation incorporating the distribution of the electric field excited by the electrode fingers F and the second-order nonlinearity of the dielectric constant in the piezoelectric substrate S. However, as will be explained later, the behavior of the measured distortion wave can be almost perfectly explained by the above thinking.

(Verification of Principle of Generation of Distortion Wave)

Figure 6:
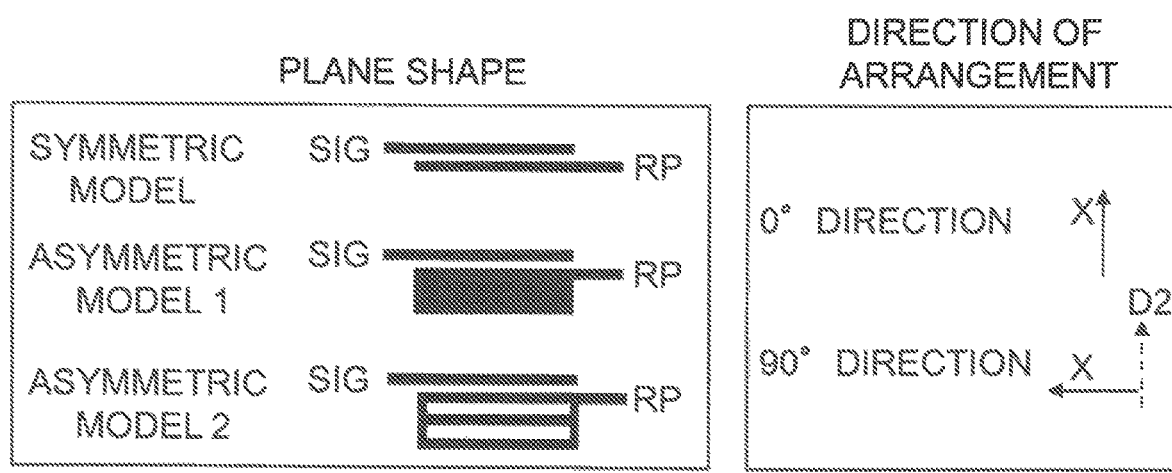
FIG. 6 is a schematic view showing a model for verifying a principle of generation of a distortion wave.

Here, the results of experiments for confirming the principle of generation of a distortion wave described above will be explained. FIG. 6 shows the prepared device in brief. The device is basically an interdigital capacitor in which two strip-shape electrodes are arranged spaced apart by a certain gap. In the present experiment, other than electrodes of the symmetrical shapes ("symmetric model") for reference, in order to confirm the distortion wave caused by the nonlinearity of electrodes, interdigital capacitors according to two types of asymmetric models 1 and 2 were prepared. The asymmetric model 1 is formed by making the width of the strip-shape electrode on one side larger, while the asymmetric model 2 is formed by configuring the electrode on one side as a plurality of strips which are short-circuited like a reflector. This simulates the end part of a first IDT 55 of a multi-mode type filter which will be explained later. As the piezoelectric substrate S, use was made of a 42°-rotated Y-cut X-propagating LiTaO$_3$ substrate. Further, the models explained above were prepared for the case where the direction of array of the two electrodes of this interdigital capacitor was made 0° with respect to the X-axis and a case where it was made 90°.

The specifications of the prepared devices are shown together in Table 1.

TABLE 1

| Direction of array | | Distortion by in-plane direction component of electric field | Distortion by depth direction component of electric field |
|---|---|---|---|
| 0° | Symmetric model | — | — |
| | Asymmetric model 1 | — | ○ |
| | Asymmetric model 2 | — | ○ |
| 90° | Symmetric model | ○ | — |
| | Asymmetric model 1 | ○ | ○ |
| | Asymmetric model 2 | ○ | ○ |

Figure 7A:
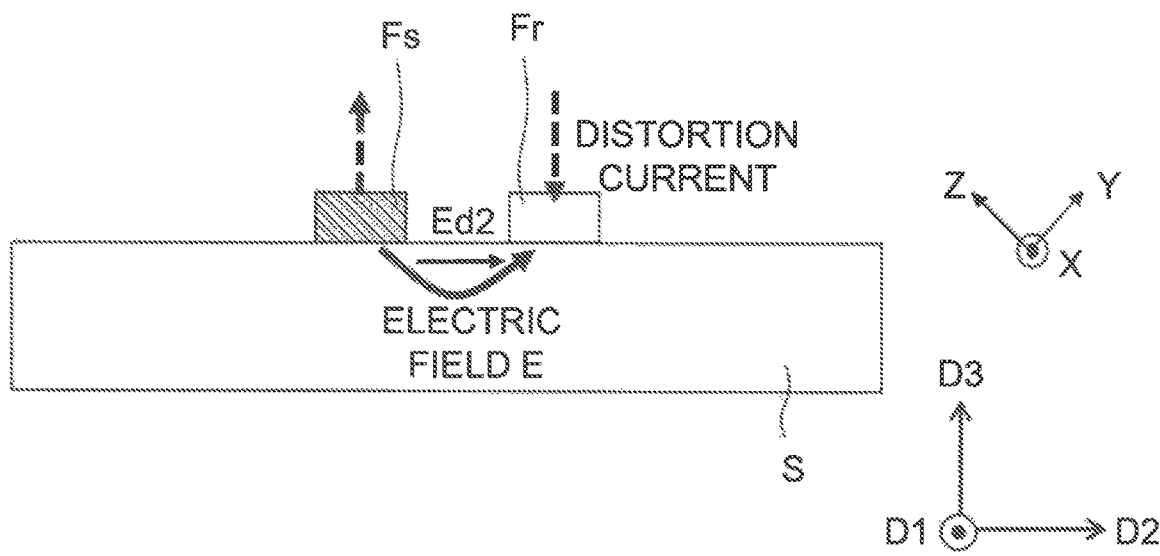
FIG. 7A is a schematic view showing a model for verifying the principle of generation of a distortion wave.

Table 1, in addition to the specifications of the devices, shows also the results expected regarding if the distortion according to the in-plane direction component Ed2 of the electric field and the distortion according to the depth direction component Ed3 of the electric field are generated according to the above principle of generation of a distortion wave. Note that, in the case where the direction of array of the two electrodes of this interdigital capacitor is made 90° with respect to the X-axis, as shown in FIG. 7A, the direction of array becomes the D2 direction and the electric field component Ed2 in the D2 direction (in-plane direction) is obtained, so it is believed that the electric field E contains the Z-axis direction component. That is, when the direction of array of the two electrodes of the interdigital capacitor is 90°, in all models, a distortion wave due to the in-plane direction component Ed2 of the electric field is generated. In addition to this, in the cases of the asymmetric models 1 and 2, a distortion wave due to the electric field component Ed3 in the depth direction is also generated. For this reason, it is believed that the distortion waves in the asymmetric models 1 and 2 are combinations of these and become complex.

Figure 7B:
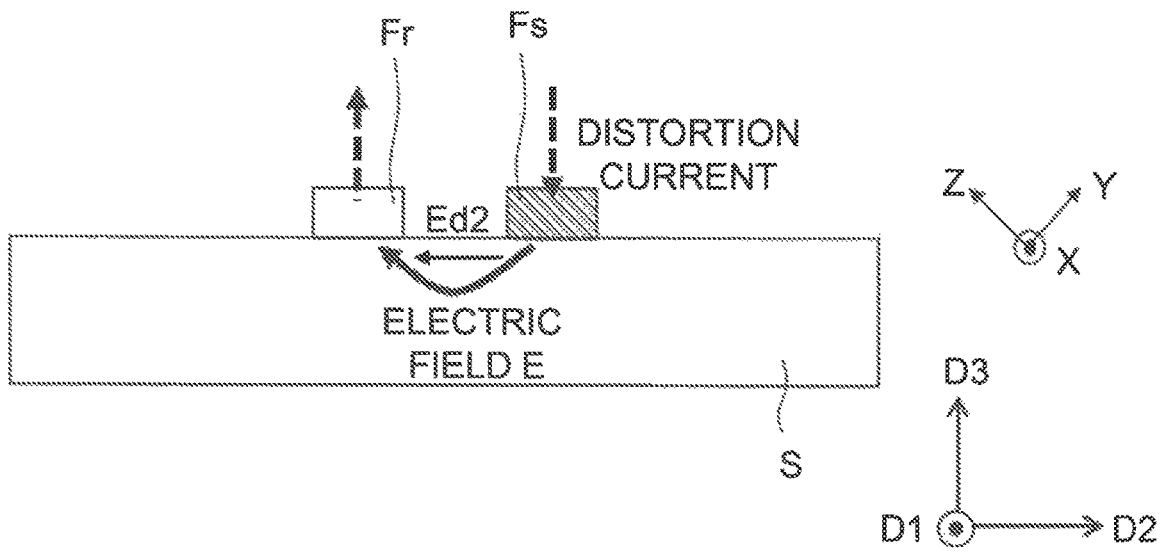
FIG. 7B is a schematic view showing a model for verifying the principle of generation of a distortion wave.

Note that, FIGS. 7A and 7B are cross-sectional views along the direction perpendicular to the direction of propagation of the SAW (D1, X).

Figure 8:
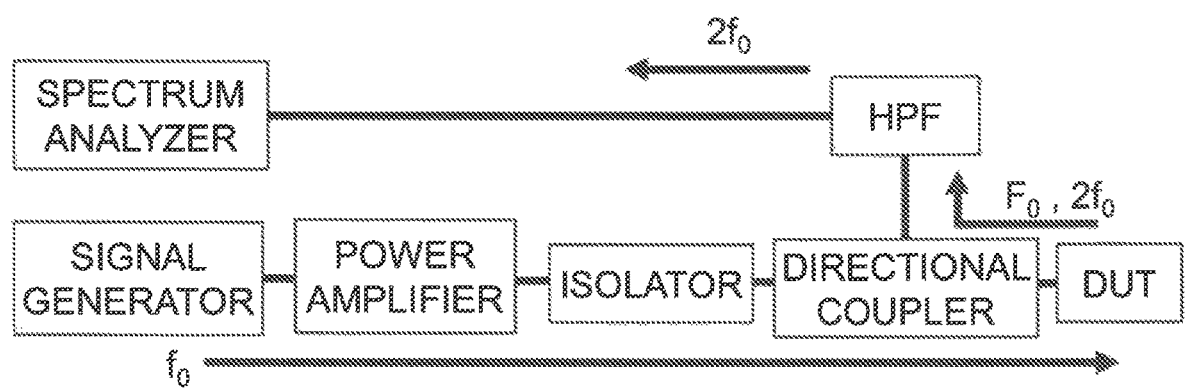
FIG. 8 is a block diagram showing a measurement system for verifying the principle of generation of a distortion wave.

FIG. 8 shows a block diagram of an evaluation system for evaluating a distortion wave (second harmonic) which is generated due to second-order nonlinearity. In this evaluation system, a signal having a predetermined power is generated in a signal generator. That signal is input through a power amplifier, isolator, and directional coupler to the device under test (DUT). The reflection wave from the DUT is input through the directional coupler to the filter (HPF). Only the second harmonic component contained in the reflection wave is measured at the spectrum analyzer (SA). The HPF is inserted in order to prevent the input signal reflected from the DUT from being input to the SA. Note that, the power of the input signal is 22 dBm, and the frequency $f_0$ is 1750 to 1950 MHz. Accordingly, the frequency of the second harmonic $2f_0$ becomes 3500 to 3900 MHz.

Further, although not shown in FIG. 8, in order to reduce the influence of the reflection wave, attenuators having a suitable attenuation level are inserted into some portions of the evaluation system shown in FIG. 8.

Figure 9A:
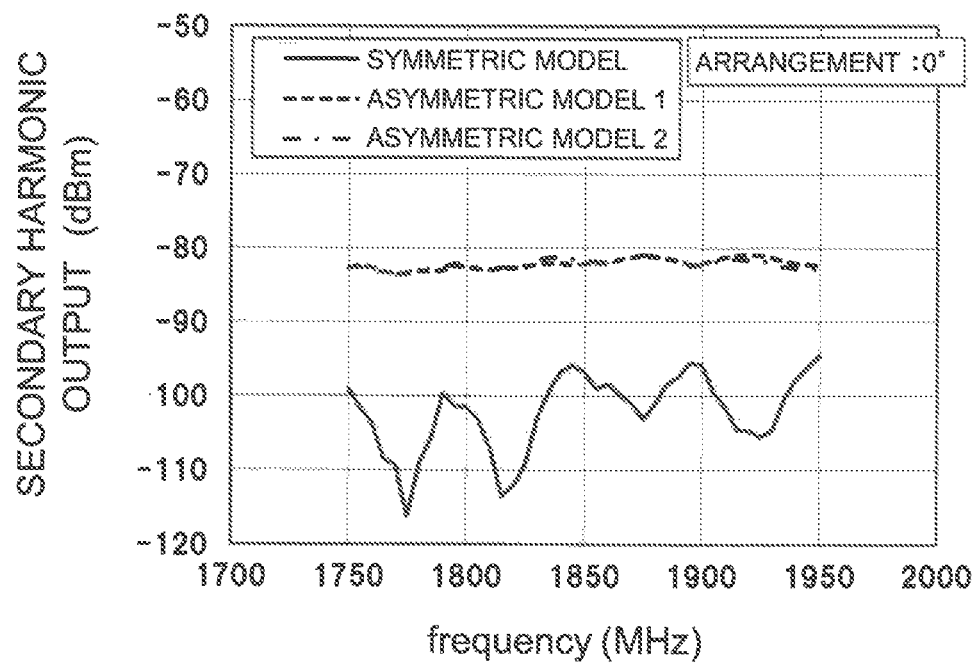
FIG. 9A is a graph showing measurement values and simulation values for verifying the principle of generation of a distortion wave.

FIG. 9A shows an example of the results of measurement of the distortion wave (second harmonic) output. In FIG. 9A, an abscissa indicates the frequency of the input signal, and an ordinate indicates the output of the distortion wave (second harmonic). Regarding the case of the 0° arrangement, the measurement result of the symmetric model is indicated by the solid line, the measurement result of the asymmetric model 1 is indicated by the broken line, and the measurement result of the asymmetric model 2 is indicated by the one-dot chain line.

This is the case where the direction of array of the two electrodes of the interdigital capacitor is 0°, therefore it is predicted that a distortion wave is not generated in the case of the symmetric models while distortion by the depth direction component of the electric field is generated in the cases of the asymmetric models 1 and 2. The measurement results also coincide with the prediction. In contrast to the distortion wave becoming very small in the case of the symmetric models, a distortion wave of about −82 dBm is generated in the cases of the asymmetric models 1 and 2. The point to be noted here resides in the fact that the distortion waves generated in the asymmetric models 1 and 2 have almost the same strength. This shows that the nonlinearity of the electric field excited in the piezoelectric substrate S is the same between the case where the electrode on one side of the interdigital capacitor has a broad width, and the case where the electrode is configured by a plurality of short-circuited strips like a reflector.

Figure 9B:
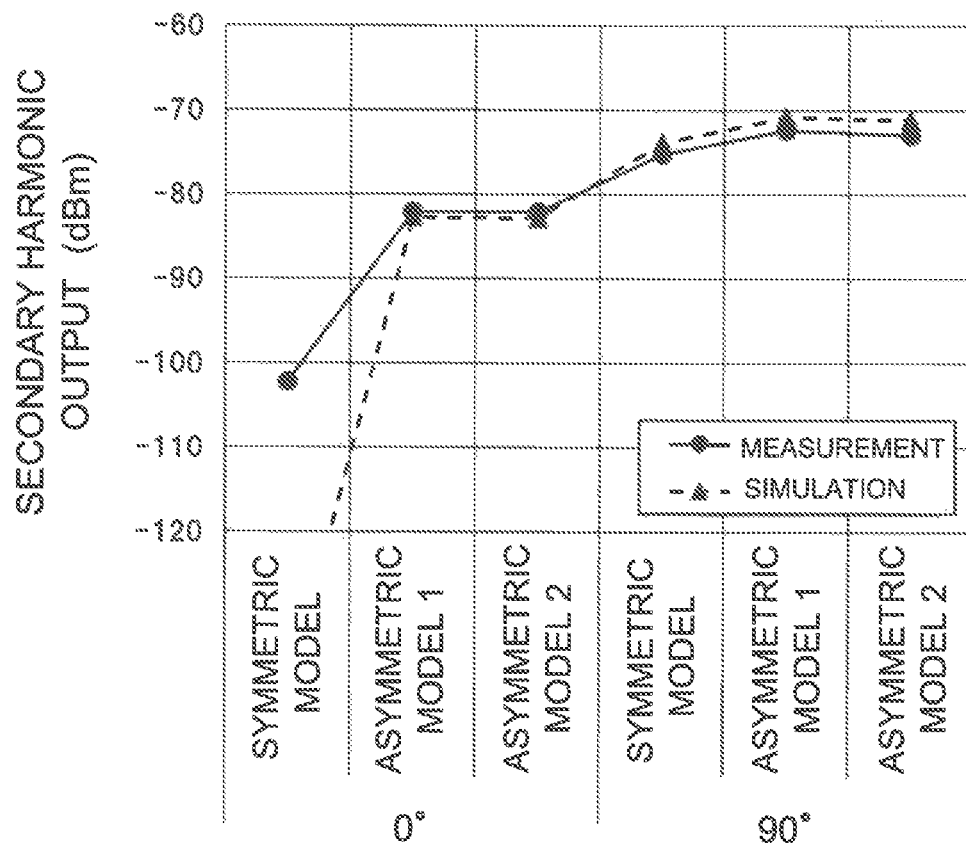
FIG. 9B is a graph showing measurement values and simulation values for verifying the principle of generation of a distortion wave.

Next, FIG. 9B shows a mean value of outputs within a range from 3500 to 3900 MHz regarding the distortion wave (second harmonic) in the six types of devices shown in Table 1. In FIG. 9B, the abscissa shows the six types of devices, and the ordinate shows the outputs of the second harmonic. The solid line indicates the measurement values of the devices, and the broken line indicates the simulation results.

The simulation was carried out as in the following way. First, according to the finite element method (FEM), a electrical potential distribution in the piezoelectric substrate excited by the electrodes of the device is calculated. Next, based on the second-order nonlinearity of the dielectric constant (second-order nonlinear dielectric constant) inside the piezoelectric substrate, the distribution of electric flux density of the second harmonic excited by the above potential distribution is calculated. Finally, based on that electric flux density, the electrical potential distribution of the second harmonic is calculated by the FEM. In this way, the strength of the second harmonic generation in electrodes having any shape and arrangement can be computed. That is the simulation based on the principle of generation of a distortion wave assuming that the distortion wave is generated according to the potential distribution and then the distribution of the electric field formed by that.

Note that, in the simulation, the computation is carried out by assuming that only Z-axis component of the dielectric constant of the piezoelectric crystal (42°-rotated Y-cut X-propagating $LiTO_3$ substrate) is not linear, and the nonlinearity in the other axial directions is small.

The simulation results and the measurement values match well, therefore it can be confirmed that the thinking of the principle of generation of distortion described above is correct.

Note that, between the symmetric models, in the model having a direction of array of 0°, the measurement value and the simulation value are unconformable. This is caused by the fact that in simulation, it is assumed that no distortion wave is generated, while by a measurement value, the measurement limit of a distortion wave is about −100 dBm. That is, it is considered that, distortion wave is not or little generated in actuality, and it is less than the measurement limit, therefore, the measurement value and the simulation value are unconformable, and the measurement value and the simulation value are conformable in actually.

Further, compared with the outputs of distortion waves of the asymmetric models 1 and 2 at the time when the direction of array of the two electrodes of the interdigital capacitor is 0°, the output of the distortion wave of the symmetric model at the time when the direction of array of the two electrodes of the interdigital capacitor is 90° is larger. It is guessed from this that the distortion wave caused by the in-plane direction component of the electric field is larger than the distortion wave caused by the asymmetry of the depth direction component of the electric field in this piezoelectric substrate S, and the magnitude of the distortion wave is influenced by adjustment of the direction of arrangement of the electrode fingers more than the influence by adjustment of the shapes of the electrode fingers as in the asymmetric models 1 and 2.

Further, in the cases of the devices of the asymmetric models 1 and 2 where the direction of arrangement is 90°, both of the distortion wave according to the in-plane direction component of the electric field and the distortion wave according to the depth direction component of the electric field are generated in the same phase. For this reason, the distortion waves are strengthened by each other to become a larger distortion wave output. Conversely, in a case where the arrangement of the electrode connected to the signal side and the electrode connected to the reference potential side is the inverse to that in the device which is prepared this time, a distortion wave according to the in-plane direction component of the electric field as shown in FIG. 7B is generated, and the polarity becomes the inverse to that in the case shown in FIG. 7A. Further, in the electrode arrangement shown in FIG. 7B, when making the width of the electrode on the reference potential side the width as in the asymmetric models 1 and 2, the two waves of the distortion wave according to the in-plane direction component of the electric field and the distortion wave according to the depth direction component of the electric field are generated by the antiphase each other, therefore the distortion waves are weakened by each other, so the distortion wave output is predicted to become smaller than that in the case of the symmetric models.

Figure 10:
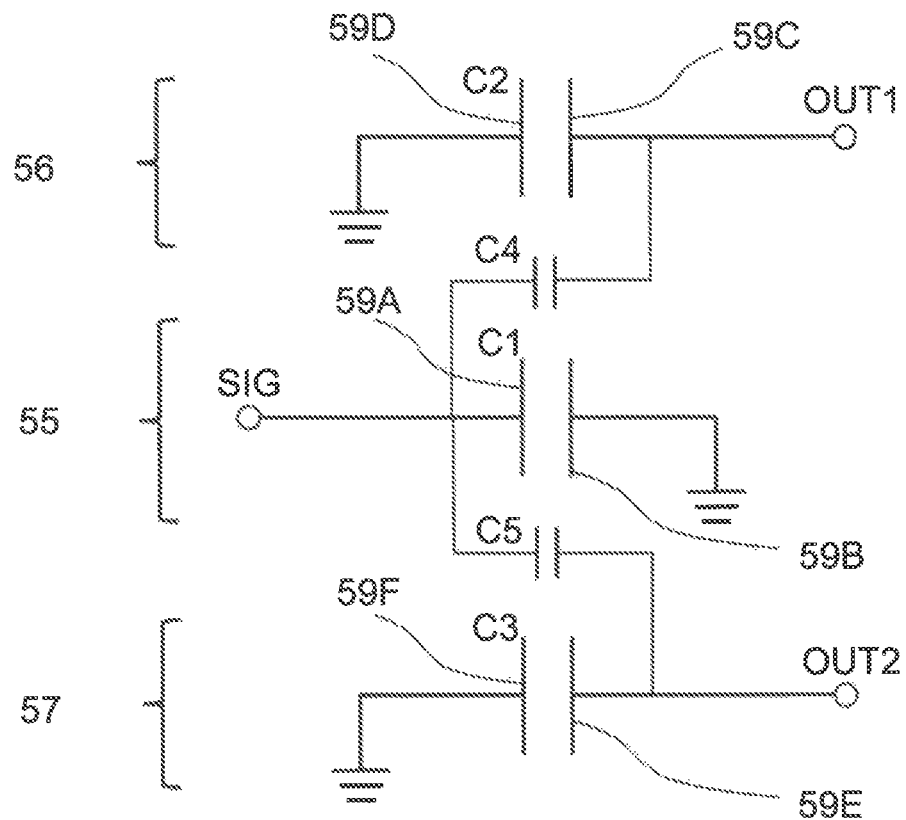
FIG. 10 is a circuit diagram for explaining the principle of generation of a distortion wave.

(Application of Principle of Generation of Distortion to Multi-mode Type Filter 17) FIG. 10 shows the multi-mode type filter 17 as a circuit diagram focusing on the electrostatic capacitance of the first to third IDTs 55 to 57. The first IDT 55 functions as the input IDT. On this, one comb-shaped electrode 59A is connected to the signal terminal SIG, and the other comb-shaped electrode 59B is connected to the ground potential (reference potential RP). Further, the second IDT 56 and third IDT 57 which are adjacent to the first IDT 55 function as the output IDT. In this, the comb-shaped electrodes 59D and 59F on one side are connected to the ground potential, while the comb-shaped electrodes 59C and 59E on the other side are connected to the output terminals OUT1 and OUT2.

Note that, the multi-mode type filters 17 shown in FIG. 2, FIG. 3, FIG. 4, and FIG. 10 are examples of so-called three-IDT type multi-mode type filters. The second IDT 56 and the third IDT 57 are connected to the output terminals OUT, but the example is not limited to this. For example, in types of the multi-mode type filter other than the three IDT type, sometimes the second IDT 56 and third IDT 57 do not always function as output IDTs. Even in that case, so far as the second IDT 56 and third IDT 57 are adjacent to the first IDT 55 and the comb-shaped electrodes 59D and 59F on one side in the second IDT 56 and third IDT 57 become the ground potential, the following explanation stands in the same way.

Consider a case where the multi-mode type filter 17 is used for the filter on the reception side of the duplexer 1. The distortion wave which becomes a problem in the duplexer 1 is generated at the time when a strong transmission signal is input to the duplexer 1. The frequency of the transmission signal TS is outside of the passband of the multi-mode type filter 17 on the reception side, therefore becomes a frequency which is far from the resonance frequency of the IDT 55 to IDT 57 of the multi-mode type filter 17. For this reason, the IDT 55 to IDT 57 do not cause resonation and behave as if they were the interdigital capacitors (C1 to C3) which are capacitance elements. That is, the first IDT 55 operates as an interdigital capacitor C1 which is connected between the signal terminal SIG and the ground potential RP. Further, the second IDT 56 and third IDT 57 which are adjacent to the first IDT 55 become the interdigital capacitors C2 and C3 with the comb-shaped electrodes 59D and 59F on one side which are connected to the ground potential and with the comb-shaped electrodes 59C and 59E on the other side which become the potentials coupled with the ground potential according to the electrostatic capacitances formed together with the comb-shaped electrodes 59D and 59F.

Here, it will be studied what types of potentials the comb-shaped electrodes 59 of the second IDT 56 and third IDT 57 appear to be from the comb-shaped electrode 59A in the first IDT 55. First, the comb-shaped electrodes 59D and 59F in the second IDT 56 and third IDT 57 are connected to the ground potential. Further, the comb-shaped electrodes 59C and 59E in the second IDT 56 and third IDT 57 are potentials which are coupled with the ground potential according to the electrostatic capacitances formed by the ground potential and the comb-shaped electrodes 59D and 59F and become values which can be approximated as being almost equal to the ground potential when compared with the potential of the signal terminal SIG. In the first comb-shaped electrodes 59C and 59E in the second IDT 56 and third IDT 57, the electrode fingers 63 at the first IDT 55 side form capacitors C4 and C5 together with the electrode fingers 63 at the second IDT 56 and the third IDT 57 sides of the first IDT 55, thus electrostatic capacitances are generated. However, each of the electrostatic capacitances of the capacitors C4 and C5 becomes the amounts of a pair of electrode fingers 63. Contrary to this, the number of electrode fingers in the second IDT 56 or third IDT 57 usually becomes several tens, therefore the electrostatic capacitances of the capacitors C2 and C3 become sufficiently large relative to the static capacitances of the capacitors C4 and C5. Due to this, it becomes unnecessary to consider the capacitors C4 and C5. When viewed from the comb-shaped electrode 59A in the first IDT 55, the comb-shaped electrodes 59C and 59E in the second IDT 56 and third IDT 57 become almost the ground potential (RP). That is, it is considered that the comb-shaped electrodes 59 in the second IDT 56 and third IDT 57 substantially appear like the ground potential from the comb-shaped electrode 59A in the first IDT 55.

For this reason, in the multi-mode type filter 17 shown in FIG. 3, it is guessed that the states of potentials of the first IDT 55 and the electrode fingers 63 in the second IDT 56 and third IDT 57 positioned nearest the first IDT 55 side become the same in situation as that shown in FIG. 5B. That is, in the first comb-shaped electrode 59A in the first IDT 55, the electrode finger 63 which is positioned at the outermost side is the end part electrode finger Fb, and the electrode fingers F in the second IDT 56 and third IDT 57 correspond to the electrode finger Fr which are positioned at the left side (Area 1) from the boundary portion.

It was considered from the above description that the distortion currents which were generated between the first IDT 55 and the second IDT 56 and between the first IDT 55 and the third IDT 57 in the multi-mode type filter 17 due to the asymmetry of the electric fields inside the substrate 53 and which were directed from the reference potential RP side toward the signal terminal SIG side were the reason for generation of a distortion wave in the multi-mode type filter 17. The magnitudes of the distortion currents are determined according to the crossing width of the electrode fingers 63 and the potential difference between the input terminal IN and the reference potential. Note that, even in a case where not an IDT, but a reflector is adjacent to the first IDT 55, asymmetry such as concentration of the electric field to the signal terminal SIG side is caused, therefore a distortion wave the same as that in the case where an IDT is adjacent is generated. In particular, when the reflector is connected to the reference potential RP side, exactly the same situation as that in the above explanation occurs.

Note that, the above explanation is the explanation for the case where one signal (transmission signal TS) is input to the multi-mode type filter 17. However, in a case where an interference signal which becomes the frequency band of the reception signal by addition or subtraction with the frequency of the transmission signal TS is input simultaneously with the transmission signal TS, these two signals are mixed according to the principle of generation of second-order distortion wave explained above, therefore a distortion wave of the frequency band of the reception signal is generated. This distortion wave has the frequency band of the reception signal, therefore passes through the multi-mode type filter 17 and becomes so-called inter-modulation distortion (IMD) which degrades the SN ratio of the reception signal.

Based on the above principle of generation, the inventors invented a method of reduction of a distortion wave which will be explained below. That is, the distortion wave of the multi-mode type filter 17 is output as a high frequency signal, therefore, they considered that if an element that generates a distortion wave having the strength equal to that of this distortion wave and having a phase difference of 180° is provided in the filter 17 or duplexer 1, by the signals being cancelled by each other, the distortion wave output to the external portion is reduced. In the present embodiment, by forming a new distortion wave by the capacitance part 70 as shown in FIG. 3, the distortion wave from the multi-mode type filter 17 is cancelled out.

(Principle of Cancelling Distortion Wave From Multi-Mode Type Filter)

Using FIG. 11 and FIG. 7B, the principle of cancelation of the distortion wave from the multi-mode type filter 17 by the capacitance part 70 will be explained. FIG. 11 is a schematic plan view of a principal part showing the configuration of a portion of the SAW element 1 shown in FIG. 3. In FIG. 11, illustration of the third IDT 57, reflector 58, etc. is omitted.

As explained above, from the multi-mode type filter 17, a distortion current is output in a direction flowing out from the signal terminal SIG side. In the SAW element 51, as shown in FIG. 3 and FIG. 11, the capacitance part 70 is connected to the signal terminal SIG of the multi-mode type filter 17. This capacitance part 70 is comprised of two counter electrodes 71A and 71B arrayed in a direction different by 90° from the direction of array of the electrode fingers 63 in the multi-mode type filter 17. In other words, the capacitance part 70 is formed by alignment of the two counter electrodes 71A and 71B in a direction different by 90° from the direction of propagation of the acoustic wave in the multi-mode type filter 17. That is, this capacitance part 70 will behave as an interdigital capacitor of the symmetric model having a direction of arrangement of 90° as shown in FIG. 6. Note, the direction of array of the counter electrode 71A connected to the side of the signal terminal and the counter electrode 71B connected to the reference potential becomes the inverse. For this reason, the states of the electric field and distortion current on the cross-section taken along the A-A line in FIG. 11 become the same as the state shown in FIG. 7B.

As shown in FIG. 7B, the counter electrodes 71A and 71B configuring the capacitance part 70 are arrayed in a direction different by 90° from the direction of array of the electrode fingers 63 in the multi-mode type filter 17, therefore the in-plane direction component of the electric field has a component of the Z-axis direction of the piezoelectric crystal of the substrate 53. For this reason, as shown in FIG. 7B, the distortion current is output from the signal terminal SIG side to the reference potential RP side.

That is, by the capacitance part 70, a distortion current having a phase difference of 180° from that of the distortion current which is generated in the multi-mode type filter 17 and is output to the signal terminal SIG side is output. By adjusting the crossing width and interval of the counter electrodes 71A and 71B so that the magnitude of this distortion current by the capacitance part 70 becomes substantially the same as that of the distortion current generated in the multi-mode type filter 17, the distortion currents can be cancelled by each other, and thus the output of the distortion wave can be reduced.

Here, the directivity of the arrangement on the substrate 53 in order to cancel the distortion current output from the multi-mode type filter 17 by the distortion current caused by the in-plane direction component of the electric field as in the capacitance part 70 changes according to the crystal orientation of the piezoelectric substrate, cutting angle, polarity, and the orientation on the substrate forming the filter, therefore it is necessary to determine the directivity of arrangement according to the principle explained in the present invention for each case.

Note that, in the duplexer 1, the strength of the transmission signal TS is higher than the strength of the reception signal RS, therefore a reduction of the distortion wave caused by the transmission signal TS greatly contributes to an improvement of characteristics of the duplexer 1. Further, as explained above, the D2 direction and D3 direction of the electric field containing the component of the Z-axis direction of the crystal orientation greatly contribute to the distortion wave generated by the multi-mode type filter 17. In the above example, the D3 direction (depth direction) is regarded as the main direction. As the distortion derived from the D2 direction, distortion according to the gap between an electrode finger 63 and a dummy electrode 67 facing this is assumed. However, in the multi-mode type filter 17, generally the number of electrode fingers 63 is small and the number of place of gap in the D2 direction is small, therefore the distortion derived from the D2 direction becomes small compared with the distortion derived from the D3 direction. For this reason, mainly, the capacitance part 70 which is designed paying attention to the distortion wave derived from the D3 direction can be applied to the multi-mode type filter 17 and can effectively cancel out the distortion generated by the multi-mode type filter 17.

As the technique of suppressing the second-order distortion wave, there is known the method according to so-called "reverse phase division" shown in WO2014/133084A dividing resonators and connecting them by inverting the direction of arrangement. However, in the multi-mode type filter 17, a large portion of the second-order distortion wave is generated due to the asymmetry of the end parts of the IDTs explained above. Therefore, where they are formed on the same substrate, distortion waves having the same polarity are generated irrespective of the directions of arrangement. For this reason, the technique of reduction of distortion by reverse phase division cannot be applied. Contrary to this, according to the present invention, the cause of generation of a distortion wave from the multi-mode type filter 17 had been elucidated first, therefore the distortion wave can be effectively reduced.

(Modification 1: Capacitance Part 75)

In the SAW element 51 explained above, the explanation was given of the example of reducing a distortion wave by causing output of the distortion current due by the electric field in the in-plane direction by the capacitance part 70. However, the distortion wave may also be reduced by the capacitance part 75 which outputs the distortion current caused by the electric field in the depth direction in place of the capacitance part 70. This capacitance part 75 behaves as an interdigital capacitor of the symmetric model having a direction of arrangement of 0° as shown in FIG. 6.

Figure 12A:
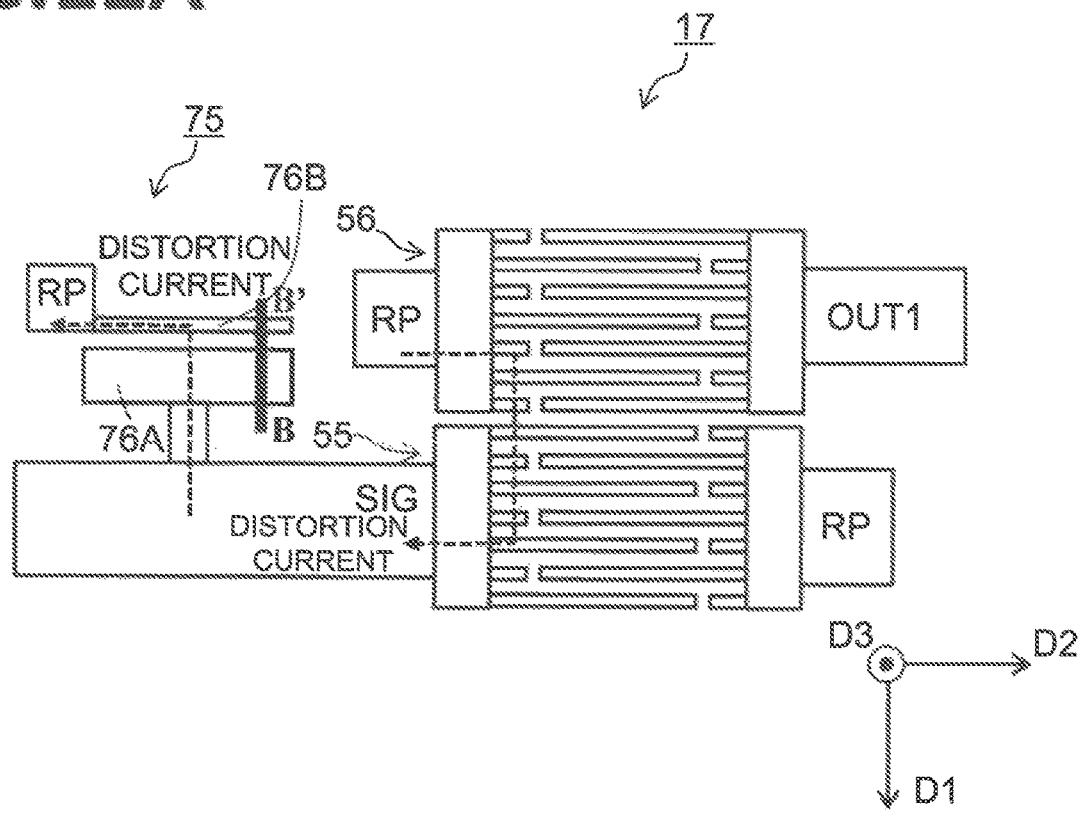
FIG. 12A is a plan view of a principal part showing a modification of the SAW element and FIG. 12B is a partial cross-sectional view taken along a B-B' line.

Using FIGS. 12A and 12B, the configuration of the capacitance part 75 will be explained. FIG. 12A is a plan view showing a portion of the multi-mode type filter 17 and the capacitance part 75. In the same way as FIG. 11, illustration of the configuration of a portion of the multi-mode type filter 17 is omitted. The capacitance part 75 is provided with a first counter electrode 76A and second counter electrode 76B. The capacitance part 75 is different from the capacitance part 70 in the direction of arrangement of the counter electrodes 76A and 76B and in that the width is different between the first counter electrode 76A, and the second counter electrode 76B.

In the capacitance part 75, the first counter electrode 76A connected to the input terminal side and the second counter electrode 76B connected to the reference potential side both extend in a direction (D2 direction) perpendicular to the direction of propagation of the SAW (D1 direction, X-axis direction) and are arranged at an interval along the direction of propagation of the SAW. Further, the width of the first counter electrode 76A in the direction of propagation of the SAW becomes larger compared with the width of the second counter electrode 76B.

The electric field excited in the substrate 53 by such a capacitance part 75 will be explained by using FIG. 12B. FIG. 12B is a cross-sectional view taken along a B-B' line in FIG. 12A. As shown in FIG. 12B, the width of the first counter electrode 76A is large, therefore the electric field is concentrated on the second counter electrode 76B side, so the electric field E becomes asymmetric between the first counter electrode 76A and the second counter electrode 76B.

The cause of the generation of distortion in the multi-mode type filter 17 is as follows. When viewed from the electrode finger 63 which is positioned at the end part of the first IDT 55 on the input side, all of the electrode fingers 63 in the adjacent output IDTs of the second IDT 56 and the third IDT 57 appear as if they were the reference potential, therefore the electric field is concentrated at the electrode finger 63 on the outermost side in the first IDT 55. In the configuration shown in FIG. 12B, conversely to this, the first counter electrode 76A on the side of the signal terminal SIG looks broad when viewed from the second counter electrode 76B connected to the reference potential. For this reason, the electric field is concentrated at the second counter electrode 76B, therefore a distortion current having an inverse polarity to that in FIG. 5B is generated. Note that, the capacitance part 75 used here corresponds to the interdigital capacitor of the "asymmetric model 1 of the direction of arrangement 0°" explained in FIG. 6.

In more detail, the electric field E becomes strong at the second counter electrode 76B side, therefore, the depth direction component Ed3 of the electric field E becomes larger on the second counter electrode 76B side than that on the first counter electrode 76A side. For this reason, the distortion currents which are generated in the first counter electrode 76A on the side connected to the input terminal and in the second counter electrode 76B on the side connected to the reference potential become different, therefore a net distortion current is output. That is, the distortion current caused by the capacitance part 75 is output to the reference potential side. From the multi-mode type filter 17, the distortion current is output to the signal terminal SIG side, therefore these two distortion currents differ in phase by 180°. By adjusting the crossing width and interval of the counter electrodes 76A and 76B so that the magnitude of the distortion current caused by the capacitance part 75 becomes substantially the same as that of the distortion current generated in the multi-mode type filter 17, the distortion currents are cancelled out by each other, and thus the output of the distortion wave of the SAW element 51 can be reduced.

Note that, in the capacitance part 75, the direction of array of the counter electrodes 76A and 76B is the X-axis (D1 direction) perpendicular to the Z-axis, therefore the Z-axis component in the electric field E appears only in the D3 direction, so it is not necessary to consider the distortion current caused by the electric field in the in-plane direction. Further, in FIGS. 12A and 12B, an explanation was given by using the example where the first counter electrode 76A and the second counter electrode 76B were arranged in order in the −D1 direction, but the D1 (X-axis) direction does not have the Z-axis component, therefore the arrangement order is not limited to this. For example, the first counter electrode 76A and the second counter electrode 76B may be arranged in order in the +D1 direction as well.

Figure 12B:
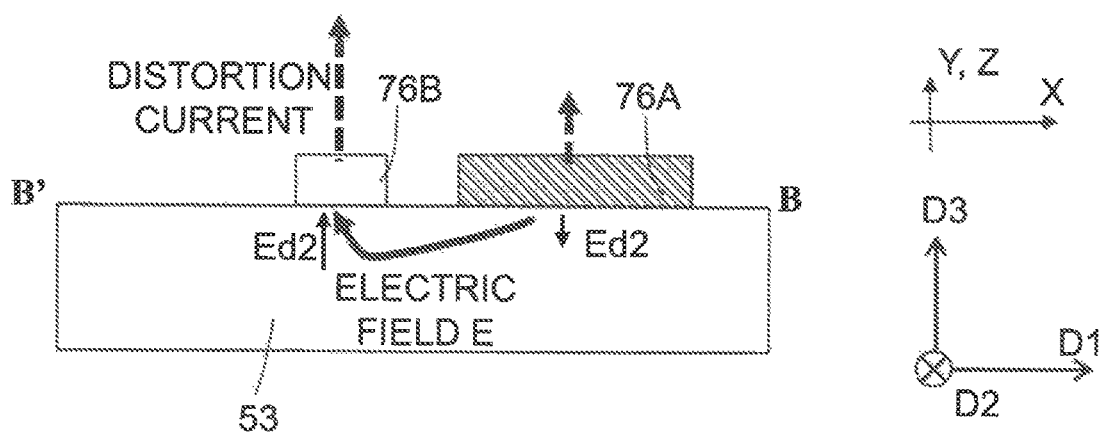

Further, in FIGS. 12A and 12B, the capacitance part 75 is positioned on the lateral side of the multi-mode type filter 17 in a direction (for example D2 direction) crossing the direction of propagation of the SAW. By arrangement in this way, the capacitance part 75 is not influenced by vibration due to the propagation of the SAW in the multi-mode type filter 17, therefore a SAW element having a high reliability can be obtained.

(Modification of Capacitance Part 75)

In FIGS. 12A and 12B, an explanation was given of the case where the widths of the counter electrodes 76A and 76B configuring the capacitance part 75 were made different, but the capacitance part 75 is not limited to this example so long as the electric field can be biased to the second counter electrode 76B side.

Figure 13A:
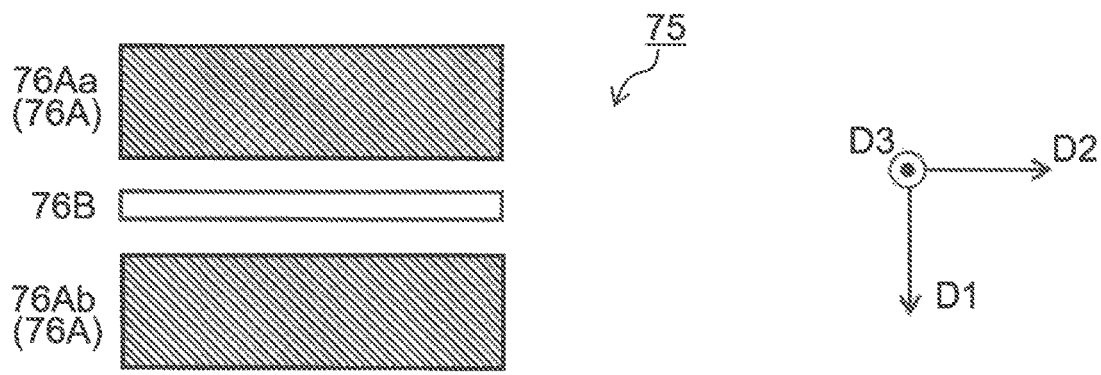
FIG. 13A is a view showing a modification of a capacitance part shown in FIG. 12A and FIG. 12B.

For example, as shown in FIG. 13A, a first counter electrode 76A having a broad width may be provided on the two sides of the second counter electrode 76B as well. That is, the first counter electrode 76A may be provided with a first electrode portion 76Aa and second electrode portion 76Ab which are arranged on the two sides in the direction of propagation of the SAW so as to sandwich the second counter electrode 76B therebetween. By employing such a configuration, a distortion current having a magnitude two times the magnitude in the case shown in FIGS. 12A and 12B can be generated. There are two places where distortion occurs in the multi-mode type filter 17: between the first IDT 55 and the second IDT 56 and between the first IDT 55 and the third IDT 57. For this reason, when simply assuming that the bias of the electric field and the strength of the transmission signal TS etc. are of the same extent between the multi-mode type filter 17 and the counter electrodes 76A and 76B, if the facing width (crossing width) of the counter electrodes 76A and 76B in FIG. 13A is set as in the same way as that for the electrode fingers 63 in the multi-mode type filter 17, the distortion current from the multi-mode type filter 17 can be almost completely cancelled out. In actuality, the degree of bias of the electric field is not uniform, and the strength of the transmission signal TS is not the same either. However, by using the configuration in FIG. 13A, the SAW element 51 can be reduced in size.

Figure 13B:
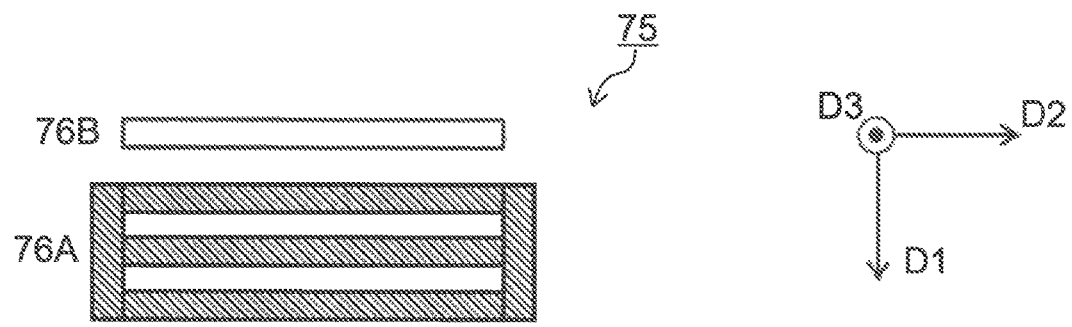
FIG. 13B is a view showing a modification of a capacitance part shown in FIG. 12A and FIG. 12B.

Further, as shown in FIG. 13B, the first counter electrode 76A may be configured like a reflector as well. In this case, the state of the electric field becomes close to the multi-mode type filter 17, and it becomes easy to arrange the magnitudes of the distortion currents. Further, when the capacitance part 75 is realized by the configuration shown in FIG. 13B, it is also possible to configure the first counter electrode 76A as a portion of the reflector 58. For example, the reflector 58 shown in FIG. 3 may be used as the first counter electrode 76A, and the second counter electrode 76B which is connected to the reference potential may be arranged outside of the former.

(Relationship of Configurations Between Piezoelectric Crystal Axis of Substrate 53 and Capacitance Parts 70 and 75)

In the example explained above, an explanation was given by taking as an example the case where use was made of a rotated Y-cut X-propagating piezoelectric crystal as the substrate, but use may be made of a negative-rotated Y-cut X-propagating piezoelectric crystal as well. Even in this case, if the capacitance parts 70 and 75 are designed considering the magnitude and polarity of the electric field in the Z-axis direction of the crystal axis, the same effects as those in the example shown in the above explanation can be obtained.

Figure 17:
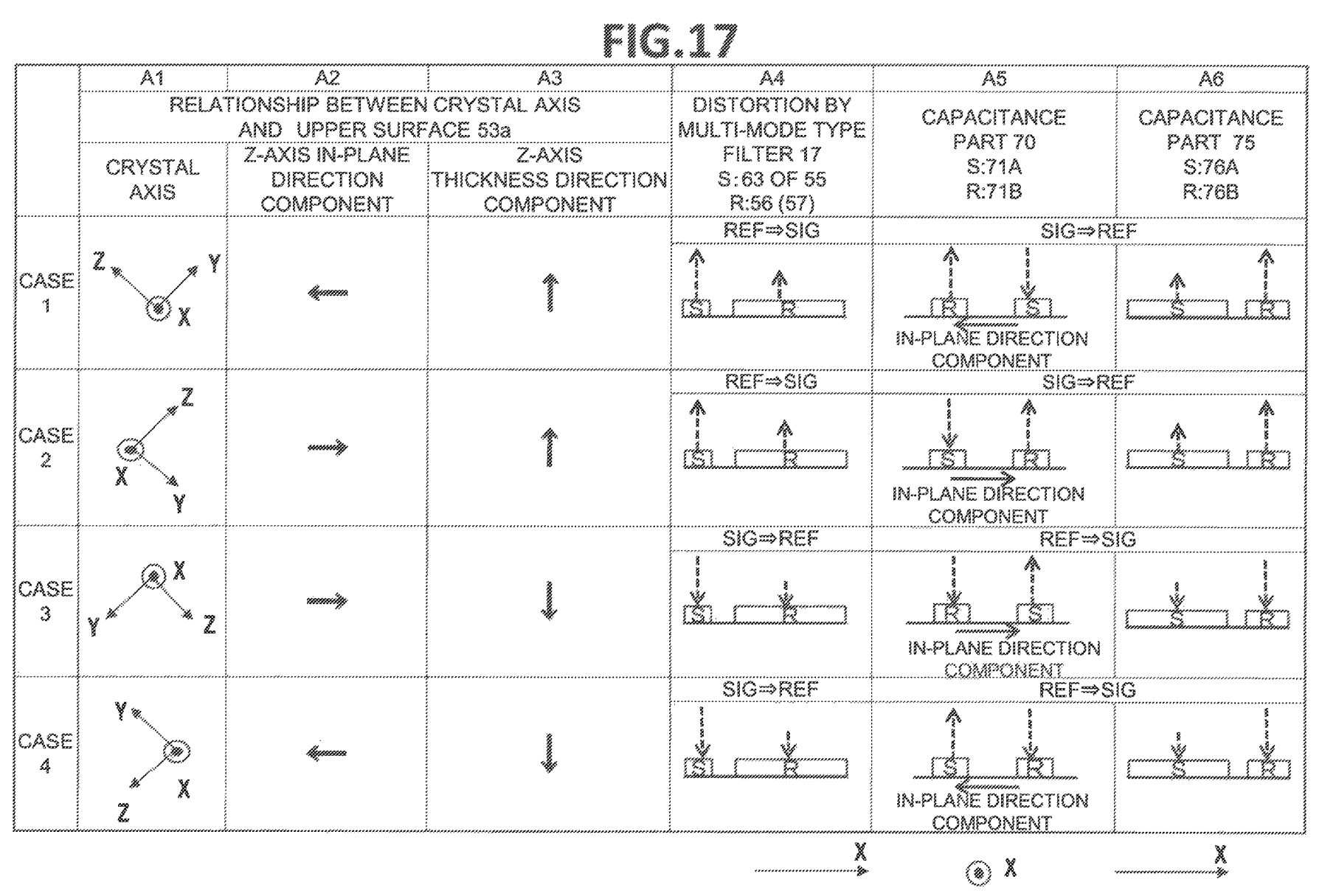

Using FIG. 17, an explanation will be given of the configurations of the capacitance parts 70 and 75 at the time when the orientation of the Z-axis of the piezoelectric crystal relative to the upper surface 53a changes according to the cutting angle etc. of the substrate 53. FIG. 17 shows the relationships of the Y-axis and the Z-axis of the piezoelectric crystal with respect to the upper surface 53a of the substrate 53 classified into Case 1 to Case 4. Case 1 to Case 4 differ in the combination of directions of the in-plane direction component and thickness direction component of the Z-axis.

Note that, in FIG. 17, the columns A1 to A3 and the column A5 are cross-sectional views in the same direction as FIGS. 7A and 7B (cross-sectional views on the plane vertical to the direction of propagation of the SAW), and the column A4 and the column A6 are cross-sectional views in the same direction as that in FIGS. 5A and 5B (cross-sectional views in the direction perpendicular to the direction of propagation of the SAW).

Here, the polarity of the distortion current output from the multi-mode type filter 17 will be studied. The distortion current output from the multi-mode type filter 17 is caused by the thickness direction component of the Z-axis. For this reason, as shown in Case 1 and Case 2, when the thickness direction component of the Z-axis is directed upward (the orientation from the lower surface 53b side of the substrate 53 toward the upper surface 53a side), the distortion current goes from the reference potential RF side toward the signal terminal SIG side. Conversely, as shown in Case 3 and Case 4, when the thickness direction component of the Z-axis is directed downward (the orientation from the upper surface 53a side of the substrate 53 toward the lower surface 53b side), the distortion current goes from the signal terminal SIG side toward the reference potential REF side.

From this fact, in Cases 1 and 2, the polarities of the distortion currents generated in the capacitance parts 70 and 75 are designed to go from the signal terminal SIG side toward the reference potential RF side. In Case 3 and Case 4, the polarities of the distortion currents generated in the capacitance parts 70 and 75 are designed to go from the reference potential RF side toward the signal terminal SIG side.

When studying the capacitance part 70, in order to generate the distortion current from the signal terminal SIG side toward the reference potential RF side, as shown in the column A5, the first counter electrode 71A and the second counter electrode 71B may be arranged in this order along the forward direction of the in-plane direction component of the Z-axis. For Case 1 and Case 2, when viewing the arrangement of the first counter electrode 71A and the second counter electrode 71B in the capacitance part 70 from the upper surface, the order of arrangement of the first counter electrode 71A and the second counter electrode 71B is the inverse. However, they are thereby arranged in the same order when considered according to the direction of the in-plane direction component of the Z-axis.

In the same way, in order to generate the distortion current from the reference potential RF side toward the signal terminal SIG side, as shown in the column A5, they may be arranged along the forward direction of the in-plane direction component of the Z-axis in the order of the second counter electrode 71B and the first counter electrode 71A. For Case 3 and Case 4, when viewing the arrangement of the first counter electrode 71A and the second counter electrode 71B in the capacitance part 70 from the upper surface, the order of arrangement of the first counter electrode 71A and the second counter electrode 71B is the inverse. However, they are thereby arranged in the same order when considered according to the direction of the in-plane direction component of the Z-axis.

Next, when studying the capacitance part 75, as shown in the column A6, by making the width of the first counter electrode 76A broader than that of the second counter electrode 76B, the biases of the electric field on the signal terminal SIG side and on the reference potential RF side are made the inverse to those of the multi-mode type filter 17, therefore a distortion current in the inverse direction to that of the multi-mode type filter 17 is automatically generated.

In the explanation of FIG. 4 etc., use is made of the surface of the 42°-rotated Y-cut X-propagating piezoelectric crystal. This corresponds to Case 1.

Note that, in the above explanation, for facilitating understanding of the polarity of the distortion current, the side to which the signal was input was defined as the "signal terminal SIG side", the direction toward the signal terminal SIG side was made the direction from the reference potential RF side to the signal terminal SIG side, and the direction of output from the signal terminal SIG side was made the direction from the signal terminal SIG side to the reference potential RF side. However, the term the "reference potential REF side" is used for comparison with respect to the signal terminal SIG side and may be connected to a potential lower than that of the signal terminal SIG. In actuality, it is not necessary to connect this to the ground.

Further, even if the direction of arrangement of the first bus bar and second bus bar in the multi-mode type filter 17 is the forward direction or reverse direction to the in-plane direction component of the Z-axis, there is no effect upon the polarity of the distortion current output from the multi-mode type filter 17.

Further, when using a 42°-rotated Y-cut X-propagating substrate, the thickness direction component and the in-plane direction component of the Z-axis have vectors having almost the same magnitude, but there is a case where the magnitudes of the two are different. For example, where use is made of a −10° to −20°-rotated Y-cut X-propagating substrate, the magnitude of the vector of the thickness direction component becomes large. In such case, the case of using the capacitance part 75 can more effectively suppress the distortion current.

(Other Modification 1: Capacitance Parts 70 and 75)

In FIG. 3, FIG. 11, and FIGS. 12A and 12B, an explanation was given of the example where the capacitance parts 70 and 75 were directly connected to the signal terminal SIG of the multi-mode type filter 17. However, the present invention is not limited to this. For example, it is also possible to connect them to a further former stage of a resonator (15 in FIG. 2) connected to the front stage of the multi-mode type filter 17 of the receiving filter 9 or connect them to the transmitting filter 5 side. In these places, generally a high frequency voltage higher than the signal terminal SIG of the multi-mode type filter 17 is applied, therefore a large distortion current is generated even if the additional capacitance is small. For this reason, the capacitance parts 70 and 75 can be reduced in size. Due to this, the entire device can be reduced in size. For example, the effects can be obtained even by a simple pair of counter electrodes without a configuration in which complex comb-shaped electrodes are meshed with each other in order to make the capacitances of the capacitance parts 70 and 75 larger. Due to this, apprehension of unintended distortion waves can be eliminated.

(Other Modification 2: Capacitance Parts 70 and 75)

In the examples shown in FIG. 3 and FIG. 11, in the capacitance part 70, the counter electrodes 71A and 71B were arrayed in a direction (D2 direction) perpendicular to the X-axis direction (D1 direction) which is the direction of propagation of the SAW, however, they need not be made different by 90°. On the upper surface 53a of the substrate 53, the electric field component derived from the Z-axis may be contained in a direction from the first counter electrode 71A toward the second counter electrode 71B. For example, it may be inclined by an angle which is the same as or less than 90° to 45° as well. More preferably, the angle of inclination may be made 30° or less as well. That is, the component formed by projecting the direction of array of the counter electrode 71A and 71B to the D2 direction may be made the −D2 direction.

In the same way, in the example shown in FIGS. 12A and 12B, the capacitance part 75 was arrayed substantially parallel to the direction of propagation of the SAW, but the direction may be inclined from the X-axis by an angle not more than 45° as well.

(Other Modification 3: Capacitance Parts 70 and 75)

In the example explained above, the lengths of the counter electrodes of the capacitance parts 70 and 75 (facing width, crossing width) may be made longer compared with the length of the electrode fingers 63 in the multi-mode type filter 17 as well. In the multi-mode type filter 17, a distortion current in accordance with the length of the electrode fingers 63 is generated at the two points. For this reason, by making the lengths of the counter electrodes in the capacitance parts 70 and 75 longer than that of the electrode fingers 63, the region of generating the electric field is secured, therefore many distortion currents having inverse phases can be generated.

Note that, in the capacitance parts 70 and 75, the interval between the centers in the widths of the counter electrodes may be made larger than the pitch of the electrode fingers 63 in the multi-mode type filter 17 as well. By employing such configuration, short-circuiting can be prevented and the reliability can be raised.

(Other Modification 4: Capacitance Parts 70 and 75)

Note that, the above description was made for the technique of cancelling out a distortion wave generated from the multi-mode type filter 17 by adding the capacitance parts 70 and 75 to the outside of the multi-mode type filter 17 as new configurations. However, they may be installed in the multi-mode type filter 17 or the resonator 15 as well. That is, in place of the capacitance parts 70 and 75, the distortion waves may be cancelled out by each other by using the distortion wave generated from a gap between the dummy electrode and the excitation electrode in the resonator 15 as well. In this case, it may be considered that the capacitance part 70 arranged with an angle of 90° is formed by the dummy electrode and excitation electrode in the resonator. In that case, the arrangement of the excitation electrodes on the side of the resonator 15 to which the signal is input and on the side from which the signal is output only have to be designed by taking the Z-axis into account.

Further, the bus bar of the second comb-shaped electrode of the first IDT in the multi-mode type filter 17 may utilized as the second counter electrode 71B and the first counter electrode 71A connected to the signal side which is arranged away from the former may be provided to form the capacitance part 70. Even in this case, it is considered that a capacitance part 70 which is arranged with an angle of 90° as in the present invention is formed.

Further, an electrode formed by dividing a portion of the reflector 58 of the multi-mode type filter 17 and connecting this to the reference potential may be used as the second counter electrode 76B, and the first counter electrode 76A having a broad width which is connected to the signal side may be provided on the outside of the former. In this case, it is also possible to consider that the capacitance part 75 arranged with an angle of 0° as in the present invention is formed.

(Other Modification 5: Capacitance Part 70)

Further, in the above description, the line width of the counter electrode 71 configuring the capacitance part 70 is made substantially the same, but may be different as well. In that case, when adjusting it so that a distortion current having the same polarity as the polarity of the distortion current according to the in-plane direction component is generated, a larger distortion current is obtained, and the capacitance part 70 can be reduced in size.

For example, when using the 42°-rotated Y-cut X-propagating substrate as shown in FIGS. 3 and 4 as the substrate 53 and configuring the capacitance part 70 on the upper surface thereof, the line width on the first counter electrode 71A side may be made broader.

(Other Modification 6: Capacitance Part 75)

In FIGS. 12A, and 12B, the capacitance part 75 is positioned on the lateral side of the multi-mode type filter 17 in the direction crossing the direction of propagation of the SAW (for example in the D2 direction), but it may be arranged on the extension of the direction of propagation of the SAW of the multi-mode type filter 17 as well. In this case, in order to suppress the influence of vibration by the SAW, the capacitance part 75 may be covered by a thick insulation film as well. As such an insulation film, for example use can be made of a cover in the case of applying WLP to the SAW element.

(Other Modifications)

Further, in the examples explained above, the explanation was given taking as an example the case where the capacitance parts 70 and 75 were connected in parallel relative to the multi-mode type filter 17, but they may be connected in series as well. Further, in the above description, the example wherein either of the capacitance parts 70 and 75 was provided was explained, but a plurality of capacitance parts 70 or plurality of capacitance parts 75 maybe provided as well. Further, both of the capacitance parts 70 and the capacitance parts 75 may be provided as well. Further, it is not necessary to limit the multi-mode type filter 17 to three stages as in the present example. It may be configured by two stages. More than three stages of IDTs may also be longitudinally coupled.

WORKING EXAMPLES

The effects of suppression of distortion waves according to the combination of the multi-mode type filter 17 and the capacitance parts 70 and 75 shown in the embodiments explained above were verified by preparing SAW elements 51 as shown in FIG. 14. Specifically, first, the multi-mode type filter 17 was prepared in the following way:

Piezoelectric substrate:
  Material: $LiTaO_3$
  Cutting angle: 42°-rotated Y-cut X-propagating IDT 55 to IDT 57:
  Material: Al—Cu
  Electrode fingers 63:
    Number (n): 31
    Pitch (p): About 2.1 µm ($\lambda$=4.2 µm)
    Gap length (d): About 0.6 µm
    Width (w): About 1.05 µm
    Crossing width: 124 µm
  Resonance frequency: Approximately 900 MHz A capacitance part 80 was prepared for the multi-mode SAW filter 17 explained above. Specifically, the capacitance part 80 becomes the same as the capacitance part 70 in basic structure. The capacitance part 80 is configured so that counter electrodes 81A and 81B are made to face each other in the direction (D2 direction) which is inclined from the direction of propagation of the SAW by 90°, and the facing length thereof was changed from 100 µm to 400 um. Further, the gap of the counter electrodes 81A and 81B is 0.75 µm. Trial production was carried out for the two cases where the direction (polarity) of the capacitance part 80 with respect to the crystal orientation had an inverse phase (cancellation) and same phase (strengthening) with respect to the phase of the distortion wave generated at the end part of the first IDT 55 of the multi-mode type filter 17. FIG. 14 shows the arrangement of the case of "cancellation". That is, in the case of "cancellation", if the forward direction of the in-plane direction component of the Z-axis is the −D2 direction, the direction from the first counter electrode 81A toward the second counter electrode 81B of the capacitance part 80 is defined as the −D2 direction.

In the case of "strengthening", the direction from the first counter electrode 81A toward the second counter electrode 81B of the capacitance part 80 is defined as the +D2 direction.

Note that, these orientations are those in the case of the 42°-rotated Y-cut X-propagating $LiTaO_3$ substrate used in the present working examples. They may be different in the case of other cutting angles. Even in such a case, if the direction of arrangement is determined along with the contents of the present specification, "cancellation" and "strengthening" can be controlled.

Further, trial production was carried out for each of the case where the capacitance part 80 was connected to the signal terminal SIG of the multi-mode type filter 17(A) and the case where it was connected to the input side of the resonator 15(B). The specifications of the trial produced filters are shown in Table 2.

Among such specifications, the filters A to C and H to K are working examples of the present invention, and the filters D to F and L to N are comparative examples.

TABLE 2

| Device No. | Additional capacitance | | | |
|---|---|---|---|---|
| | Connection place | Phase | Length | |
| Reference | — | — | — | |
| Filter A | A | Cancellation | 100 um | Working examples |
| Filter B | | | 200 um | |
| Filter C | | | 300 um | |
| Filter D | | Strengthening | 100 um | Comparative examples |
| Filter E | | | 200 um | |
| Filter F | | | 300 um | |
| Filter H | B | Cancellation | 100 um | Working examples |
| Filter I | | | 200 um | |
| Filter J | | | 300 um | |
| Filter K | | | 400 um | |
| Filter L | | Strengthening | 100 um | Comparative examples |
| Filter M | | | 200 um | |
| Filter N | | | 300 um | |

For the measurement of the distortion waves output from the trial produced SAW elements (filters), use was made of the same measurement system as that in FIG. 8. Specifically, the SAW elements were arranged in the DUT in FIG. 8, and a terminator was connected to the output side of the multi-mode type filter 17. The measurement conditions are as follows.
Input signal:
Power: 22 dBm
Frequency: 750 to 950 MHz
Computation target: Power of Second Harmonic (1500 to 1900 MHz)

Figure 15A:
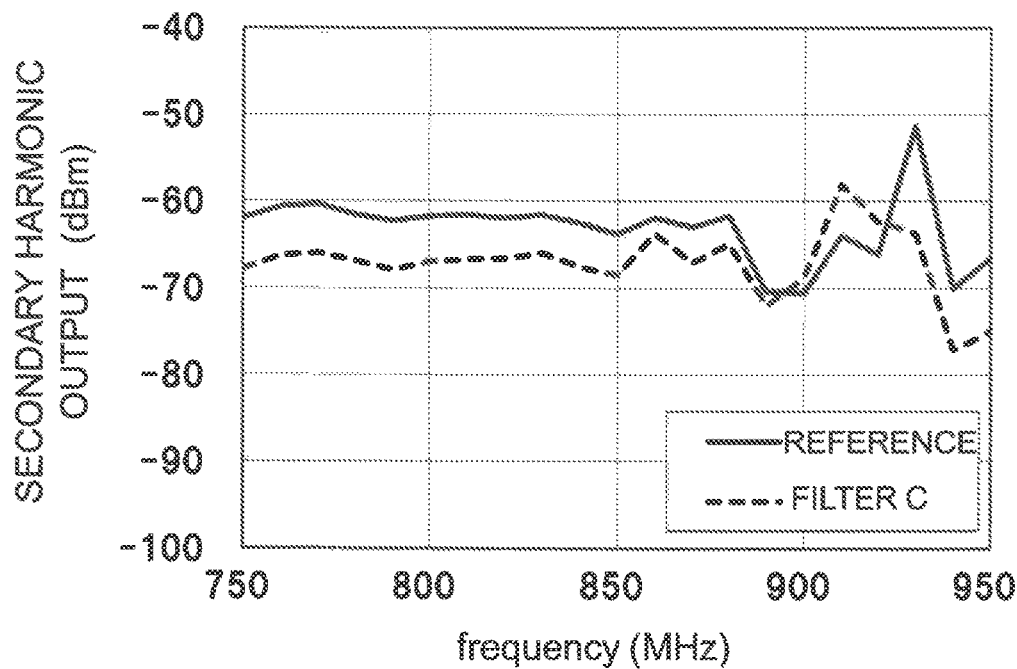
FIG. 15A is a graph showing measurement result of a secondary harmonic output from the SAW elements in a reference example and working example.
Figure 15B:
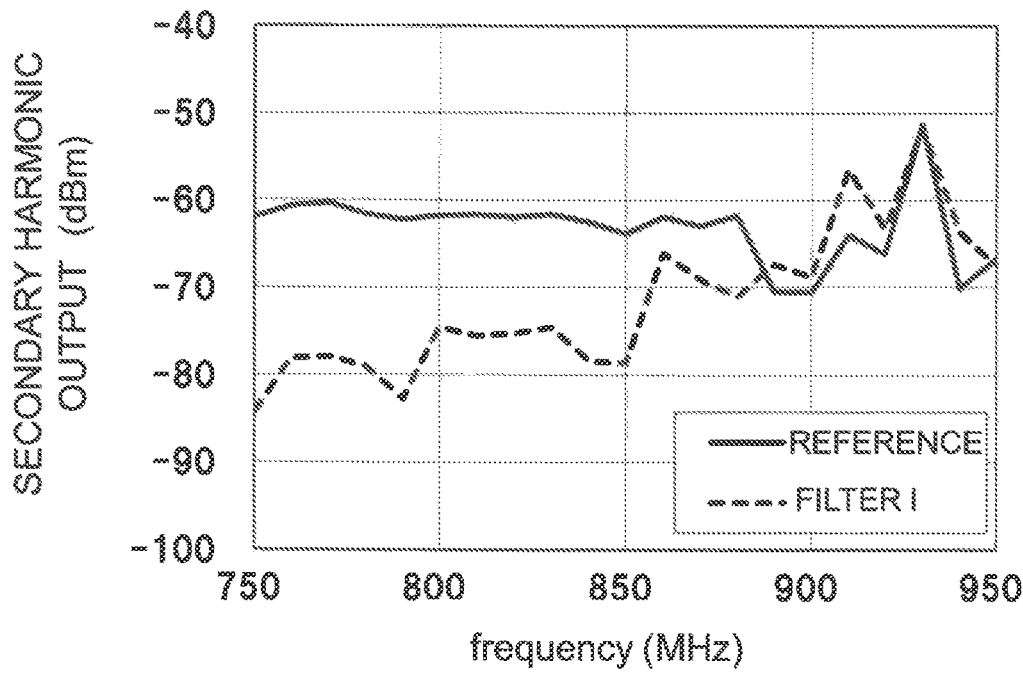
FIG. 15B is a graph showing measurement result of a secondary harmonic output from the SAW elements in a reference example and working example.

FIG. 15A shows the measurement result of the distortion wave of the filter C in the case where the capacitance part 80 is connected to A, and FIG. 15B shows the measurement result of the distortion wave of the filter I where the capacitance part 80 is connected to B. The abscissas show the frequencies of the input signals, and the ordinates show the outputs of the second harmonics. In the graphs, the characteristics of the filter C and filter I are indicated by the broken lines, and the characteristics in the case where the capacitance part 80 is not connected (reference) are indicated by the solid lines.

The passbands of the filters in the present working examples are about 900 MHz to 950 MHz, and the peak of the distortion wave appears in this frequency band. This is a distortion wave caused by mechanical nonlinearity along with the resonation of the IDT 55 to IDT 57. At a frequency other than that (750 MHz to 900 MHz in FIGS. 15A and 15B), the vibration of the IDT 55 to IDT 57 is small, therefore the contribution of the distortion wave caused by the nonlinearity of the dielectric constant explained in detail in the present invention becomes large. When this filter is used for the reception side filter 9 in the duplexer 1, the input wave having a large signal strength which becomes the problem is the transmission wave on the lower frequency side than the passband of the receiving filter. For this reason, the mainstream of the distortion wave generated in the multi-mode type filter 17 on the reception side becomes the distortion wave caused by the nonlinearity of the dielectric constant. In the filter C and filter I which are the SAW elements 1 in the present invention, it is seen that the distortion wave output (second harmonic output) in the case of the input frequency of 750 MHz to 900 MHz which becomes the problem in the reception side filter 9 of the duplexer 1 described above is reduced compared with the reference.

Further, compared with the filter C, the filter I can reduce the output of the distortion wave more effectively. The reason for this is believed to be that the distortion wave derived from the capacitance part 80 can be made larger by connecting the capacitance part 80 to the position of B having a strong signal strength.

Figure 16A:
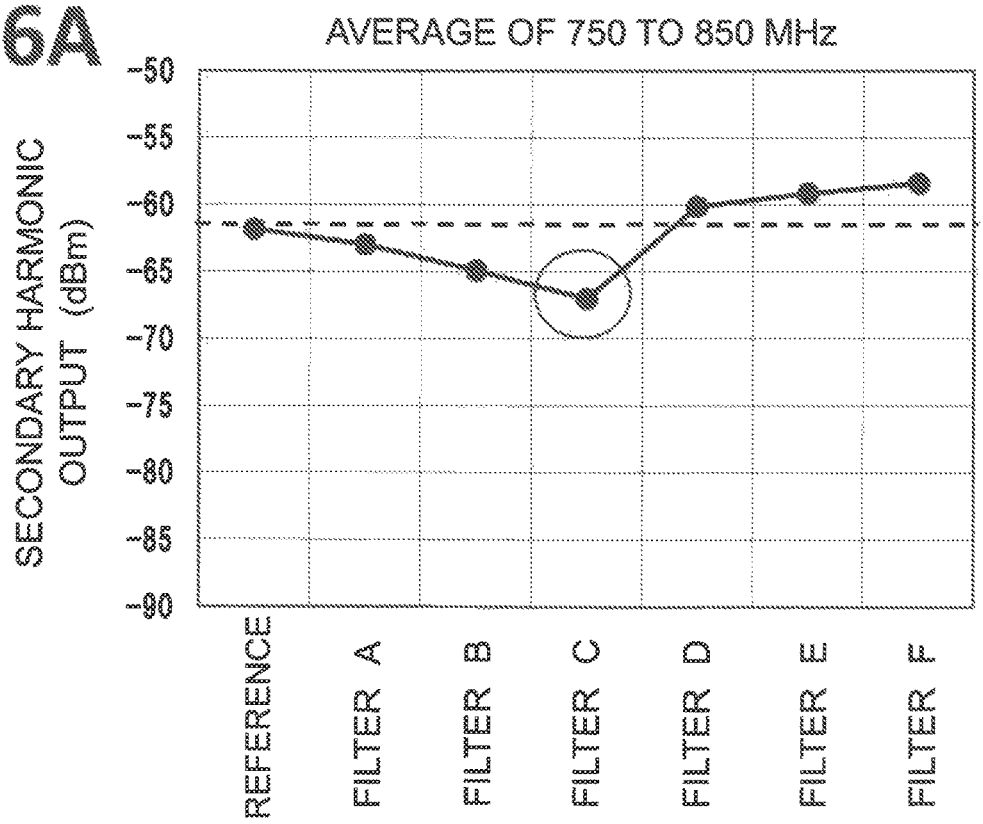
FIG. 16A is a graph showing measurement results of the secondary harmonic in the SAW elements in the reference example, comparative examples, and working examples.
Figure 16B:
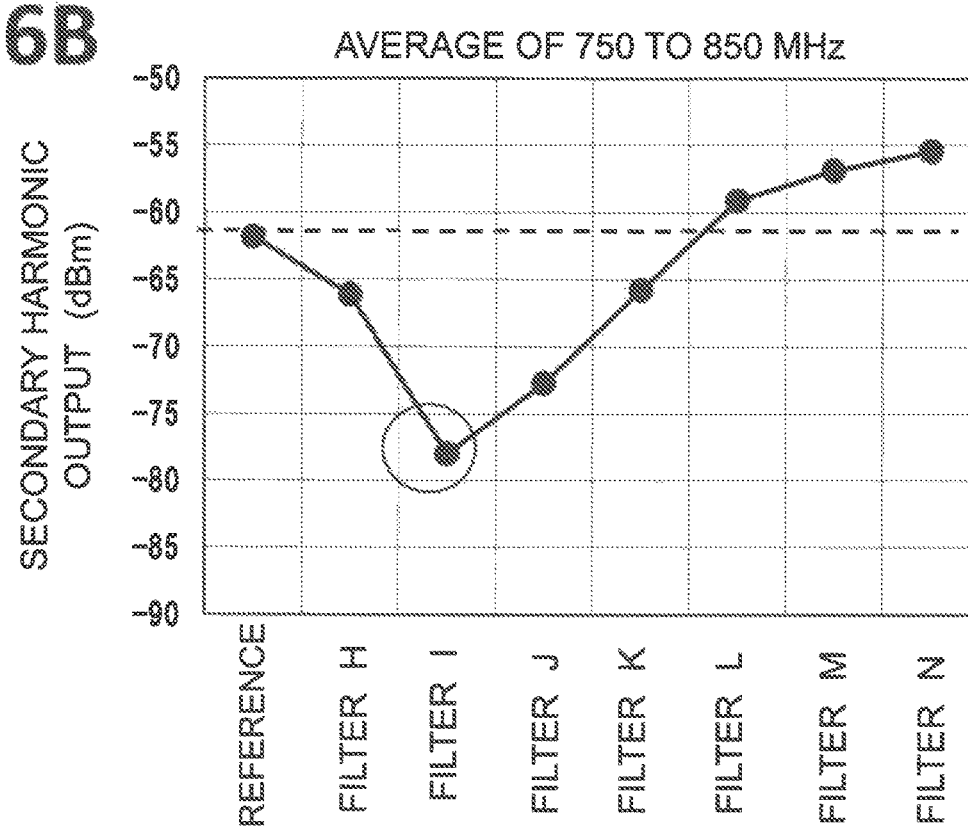
FIGS. 16B is a graph showing measurement results of the secondary harmonic in the SAW elements in the reference example, comparative examples, and working examples.

FIGS. 16A and 16B show the distortion wave outputs (second harmonic outputs) of the filters. In FIGS. 16A and 16B, the abscissas show the filter names, and the ordinates show the averages of strengths of the second harmonics of 750 MHz to 850 MHz. In the filters A, B, and C, and filters H, I, J, and K according to the working examples, it is seen that the distortion waves are reduced more than the reference. Further, in the filters D, E, F, and filters L, M, and N of the comparative examples, the distortion waves become larger than the reference. This is because the distortion wave generated in the capacitance part 80 becomes the same phase as that of the distortion wave generated in the multi-mode type filter 17, therefore these two distortion waves are strengthened by each other, so a larger distortion wave than the reference is output.

Further, in FIGS. 16A and 16B, in the filter C and filter I, the distortion wave becomes the smallest. This is because the distortion wave generated in the capacitance part 80 and the distortion wave generated in the multi-mode type filter 17 have inverse phases and almost the same strengths, therefore the distortion waves are cancelled out by each other. By suitably setting the lengths of the counter electrodes 71A and 71B in the capacitance part 80 in this way, the effect of mutually cancelling out the distortion waves can be raised. The capacitance part 80 changes according to the gap of the counter electrodes 81A and 81B, crossing width and pitch of the multi-mode type filter 17, cutting angle of the substrate 53, electrode thickness of the electrode finger 63, and so on, therefore the optimum length must be derived in each case. This derivation may be made also by the simulation explained in FIG. 9A other than the method of producing the filters on a trial basis in actuality. Note that, in the filters in which the capacitance part 70 was connected to the connection place B in FIG. 14, that is, the filters H, I, J, and K, a larger effect of reduction of distortion is obtained in the capacitance part 70 having a short length. This is because, the connection place B nearer the input terminal of the filter has a larger strength of the input signal, therefore a distortion wave generated in the capacitance part 70 becomes larger in the case where the capacitance part 70 is connected here.

REFERENCE SIGNS LIST

51 . . . SAW element (acoustic wave element), 53 . . . piezoelectric substrate, 53a . . . upper surface, 53b . . . lower surface, 55 . . . first IDT, 56 . . . second IDT, 57 . . . third IDT, 58 . . . reflector, 70 and 75 . . . capacitance parts, 71A and 76A. first counter electrodes, and 71B and 76B . . . second counter electrodes.

The invention claimed is:
1. An acoustic wave element, comprising:
a substrate comprised of a $LiTaO_3$ or $LiNbO_3$ piezoelectric crystal, wherein the substrate comprises an upper surface and a lower surface;
a multi-mode type filter comprising a first IDT to which a signal is input and a second IDT which is adjacent to the first IDT, the first IDT comprising a first comb-shaped electrode and a second comb-shaped electrode which is connected to a reference potential, each comb-shaped electrode being located on the upper surface of the substrate and comprising a plurality of electrode fingers; and
a capacitance part comprising a first counter electrode which is electrically connected to the first IDT at the first comb-shaped electrode side, and a second counter electrode which is arranged at a distance from the first counter electrode and is connected to the reference potential, each counter electrode being located on the upper surface of the substrate,
wherein the substrate and the capacitance part comprise the configuration of (1) or (2):
(1) in the substrate, a Z-axis of the piezoelectric crystal is directed from the lower surface toward the upper surface of the substrate, but the Z-axis is not perpendicular to the upper surface, and in the capacitance part, the first counter electrode and the second counter electrode are arranged in this order along a forward direction of the Z-axis of the piezoelectric crystal in a plan view of the upper surface of the substrate;
(2) in the substrate, the Z-axis of the piezoelectric crystal is directed from the upper surface toward the lower surface of the substrate, but the Z-axis is not perpendicular to the upper surface, and in the capacitance part, the first counter electrode and the second counter electrode are arranged in this order along the forward direction of the Z-axis of the piezoelectric crystal in a plan view of the upper surface of the substrate.
2. The acoustic wave element according to claim 1, wherein an inclination of the direction from the first counter electrode toward the second counter electrode in the capacitance part relative to the direction perpendicular to the direction of propagation of the acoustic wave is 45° or less.

3. The acoustic wave element according to claim 1, wherein the direction from the first counter electrode toward the second counter electrode in the capacitance part is perpendicular to the direction of propagation of the acoustic wave.
4. The acoustic wave element according to claim 1, further comprising an auxiliary resonator electrically connected to the first comb-shaped electrode of the first IDT, wherein the capacitance part is electrically connected to the multi-mode type filter through the auxiliary resonator.
5. The acoustic wave element according to claim 1, wherein a facing width of the first counter electrode and the second counter electrode is longer than the length of the electrode fingers.
6. The acoustic wave element according to claim 1, wherein the capacitance part is positioned on the lateral side of the multi-mode type filter in the direction perpendicular to the direction of propagation of the acoustic wave.
7. The acoustic wave element according to claim 1, wherein a distance from the center of the width of the first counter electrode to the center of the width of the second counter electrode is larger than a distance between adjacent electrode fingers in the first IDT.
8. A multiplexer, comprising:
an antenna terminal,
a transmitting filter filtering a transmission signal and outputting the result to the antenna terminal, and
a receiving filter filtering a reception signal from the antenna terminal,
wherein the receiving filter is configured by the acoustic wave element according to claim 1.
9. A communication module, comprising:
an antenna,
the multiplexer according to claim 8 which is electrically connected to the antenna, and
an RF-IC which is electrically connected to the multiplexer.
10. The acoustic wave element according to claim 1, wherein a gap between the first counter electrode and the second counter electrode is larger than a gap between the electrode fingers in the first IDT.
11. An acoustic wave element, comprising
a substrate comprised of a piezoelectric crystal, wherein the substrate comprises an upper surface;
a multi-mode type filter comprising a first IDT to which a signal is input and a second IDT which is adjacent to the first IDT, the first IDT comprising a first comb-shaped electrode and a second comb-shaped electrode which is connected to a reference potential, each comb-shaped electrode being located on the upper surface of the substrate and comprising a plurality of electrode fingers; and
a capacitance part comprising a first counter electrode which is electrically connected to the first IDT at the first comb-shaped electrode side, and a second counter electrode which is arranged at a distance from the first counter electrode and is connected to the reference potential, each counter electrode being located on the upper surface of the substrate,
wherein, in the capacitance part, the first counter electrode and the second counter electrode are arranged in the direction of propagation of the acoustic wave, and the width of the first counter electrode in the direction of propagation of the acoustic wave is larger than the width of the second counter electrode in the direction of propagation of the acoustic wave.

12. The acoustic wave element according to claim 11, wherein the direction from the first counter electrode toward the second counter electrode is substantially parallel to the direction of propagation of the acoustic wave.

13. The acoustic wave element according to claim 11, wherein the second counter electrode is a rectangular shape, and the first counter electrode comprises a first electrode portion and a second electrode portion each comprising a rectangular shape, which are arranged so as to sandwich the second counter electrode therebetween in the direction of propagation of the acoustic wave.

14. The acoustic wave element according to claim 11, further comprising an auxiliary resonator electrically connected to the first comb-shaped electrode of the first IDT, wherein the capacitance part is electrically connected to the multi-mode type filter through the auxiliary resonator.

15. The acoustic wave element according to claim 11, wherein a facing width of the first counter electrode and the second counter electrode is longer than the length of the electrode fingers.

16. The acoustic wave element according to claim 11, wherein the capacitance part is positioned on the lateral side of the multi-mode type filter in the direction perpendicular to the direction of propagation of the acoustic wave.

17. The acoustic wave element according to claim 11, wherein a distance from the center of the width of the first counter electrode to the center of the width of the second counter electrode is larger than a distance between adjacent electrode fingers in the first IDT.

18. A multiplexer, comprising:
an antenna terminal,
a transmitting filter filtering a transmission signal and outputting the result to the antenna terminal, and
a receiving filter filtering a reception signal from the antenna terminal,
wherein the receiving filter is configured by the acoustic wave element according to claim 5.

19. A communication module, comprising:
an antenna,
the multiplexer according to claim 18 which is electrically connected to the antenna, and
an RF-IC which is electrically connected to the multiplexer.

20. The acoustic wave element according to claim 11, wherein a gap between the first counter electrode and the second counter electrode is larger than a gap between the electrode fingers in the first IDT.

* * * * *